United States Patent
Ishino et al.

(10) Patent No.: US 9,520,345 B2
(45) Date of Patent: Dec. 13, 2016

(54) SEMICONDUCTOR MODULE, SEMICONDUCTOR DEVICE HAVING SEMICONDUCTOR MODULE, AND METHOD OF MANUFACTURING SEMICONDUCTOR MODULE

(71) Applicant: DENSO CORPORATION, Kariya, Aichi-pref. (JP)

(72) Inventors: Hiroshi Ishino, Okazaki (JP); Tomokazu Watanabe, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/956,474

(22) Filed: Dec. 2, 2015

(65) Prior Publication Data
US 2016/0126167 A1 May 5, 2016

Related U.S. Application Data

(62) Division of application No. 14/235,571, filed as application No. PCT/JP2012/005062 on Aug. 9, 2012, now Pat. No. 9,240,371.

(30) Foreign Application Priority Data

Aug. 10, 2011 (JP) .................................. 2011-174776
Aug. 10, 2011 (JP) .................................. 2011-174777

(51) Int. Cl.
*H01L 23/495* (2006.01)
*H01L 23/40* (2006.01)
(Continued)

(52) U.S. Cl.
CPC ..... *H01L 23/49562* (2013.01); *H01L 21/4825* (2013.01); *H01L 21/4871* (2013.01);
(Continued)

(58) Field of Classification Search
CPC .. H01L 21/4825; H01L 21/4871; H01L 21/50; H01L 21/565; H01L 23/3114; H01L 23/4006; H01L 23/4334; H01L 23/473; H01L 23/4952; H01L 23/49537; H01L 23/49562; H01L 23/49575; H01L 25/072; H01L 2224/06181; H01L 2224/32245; H01L 2224/48091
(Continued)

(56) References Cited

U.S. PATENT DOCUMENTS

2002/0057553 A1* 5/2002 Jeon ........................ H01L 23/34
 361/709
2003/0132530 A1 7/2003 Teshima et al.
(Continued)

FOREIGN PATENT DOCUMENTS

JP 2007-335538 A 12/2007
JP 2010-010173 A 1/2010
JP 2010-199251 A 9/2010

OTHER PUBLICATIONS

International Search Report and Written Opinion mailed Nov. 6, 2012 for the corresponding international application No. PCT/JP2012/005062 (with English translation).
(Continued)

*Primary Examiner* — Jarrett Stark
*Assistant Examiner* — Shahed Ahmed
(74) *Attorney, Agent, or Firm* — Posz Law Group, PLC

(57) ABSTRACT

A semiconductor module is configured such that heat radiation substrates are connected to lead frames and semiconductor chips are directly connected to the lead frames, so that the semiconductor chips are not connected to the lead frames through conductive portions of the heat radiation substrates. Therefore, the conductive portions can have a solid shape without being divided. As such, an occurrence of curving of the heat radiation substrates is suppressed when
(Continued)

a temperature is reduced from a high temperature to a room temperature after resin-sealing at the high temperature or the like. Therefore, connection between the semiconductor chip and the lead frames and connection between the lead frames and the heat radiation substrates enhance.

4 Claims, 16 Drawing Sheets

(51) Int. Cl.

| | | |
|---|---|---|
| *H01L 23/433* | (2006.01) | |
| *H01L 23/473* | (2006.01) | |
| *H01L 21/50* | (2006.01) | |
| *H01L 25/07* | (2006.01) | |
| *H01L 21/48* | (2006.01) | |
| *H01L 21/56* | (2006.01) | |
| *H01L 23/31* | (2006.01) | |

(52) U.S. Cl.
CPC ............ *H01L 21/50* (2013.01); *H01L 21/565* (2013.01); *H01L 23/3114* (2013.01); *H01L 23/4006* (2013.01); *H01L 23/4334* (2013.01); *H01L 23/473* (2013.01); *H01L 23/4952* (2013.01); *H01L 23/49537* (2013.01); *H01L 23/49568* (2013.01); *H01L 23/49575* (2013.01); *H01L 25/072* (2013.01); *H01L 2224/06181* (2013.01); *H01L 2224/32245* (2013.01); *H01L 2224/48091* (2013.01); *H01L 2224/48247* (2013.01); *H01L 2224/73265* (2013.01); *H01L 2924/13055* (2013.01); *H01L 2924/13091* (2013.01); *H01L 2924/181* (2013.01); *H01L 2924/30107* (2013.01)

(58) Field of Classification Search
USPC .............. 257/666, 675, 676, 706, 787, 796; 438/112, 122, 123, 124, 125, 127
See application file for complete search history.

(56) References Cited

U.S. PATENT DOCUMENTS

| | | |
|---|---|---|
| 2004/0080028 A1* | 4/2004 | Yanagisawa ........ H01L 23/3107 257/675 |
| 2004/0169289 A1 | 9/2004 | Satou et al. |
| 2007/0145540 A1 | 6/2007 | Mochida |
| 2009/0116197 A1 | 5/2009 | Funakoshi et al. |
| 2009/0224381 A1 | 9/2009 | Ishihara et al. |
| 2010/0284698 A1* | 11/2010 | McColloch .......... G02B 6/4201 398/135 |
| 2010/0308421 A1 | 12/2010 | Muto et al. |
| 2012/0223321 A1 | 9/2012 | Lin et al. |
| 2013/0075880 A1 | 3/2013 | Chen et al. |

OTHER PUBLICATIONS

Office Action mailed Nov. 12, 2013 in corresponding Japanese Application No. 2011-174777 (with English translation).

* cited by examiner

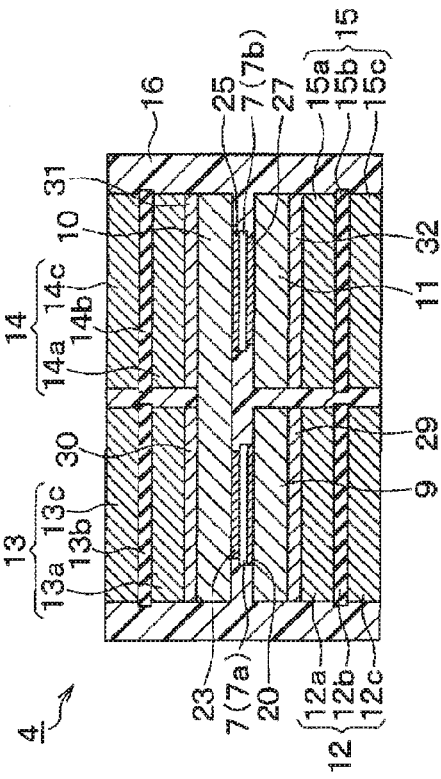
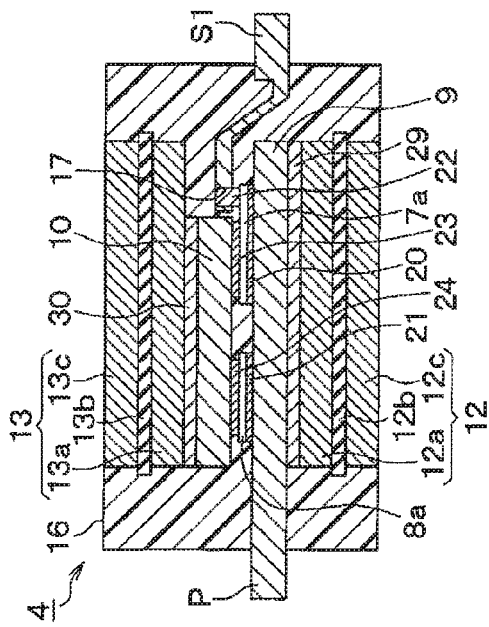
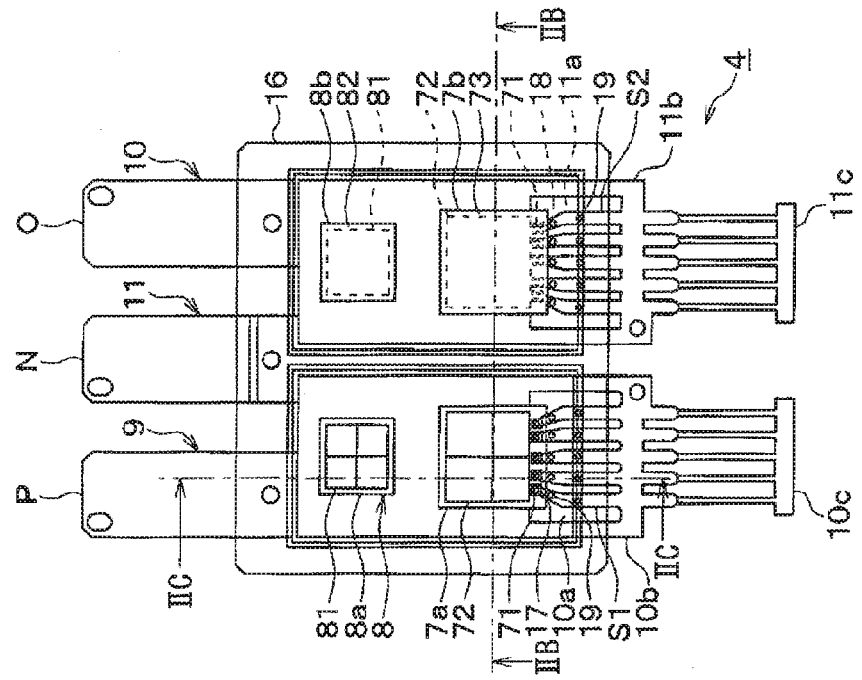

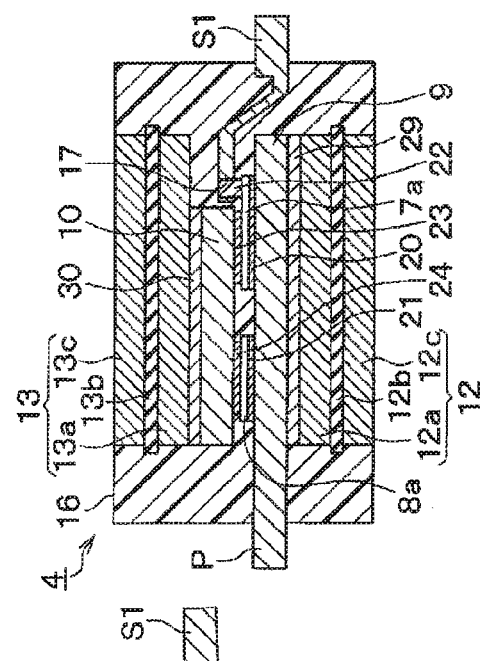
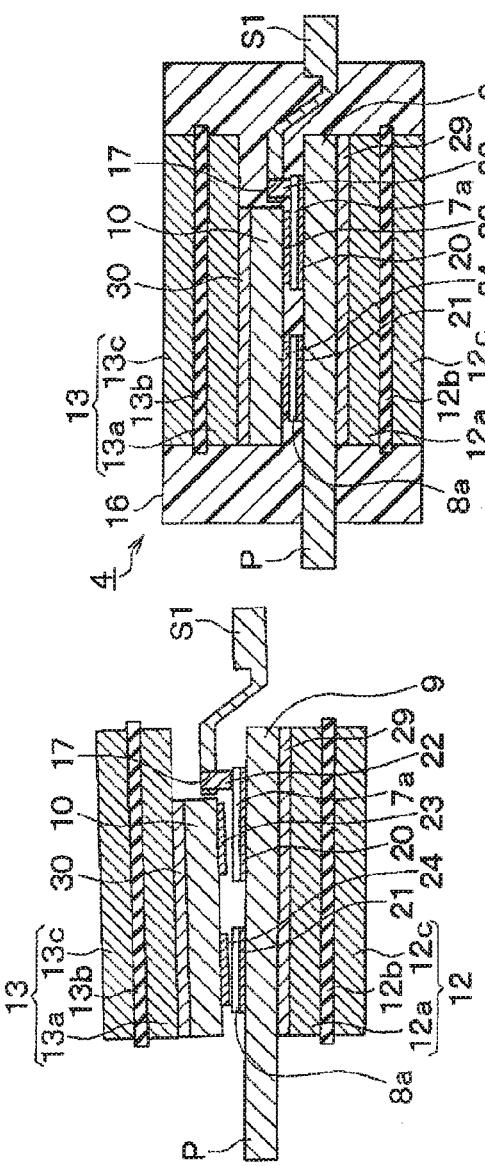
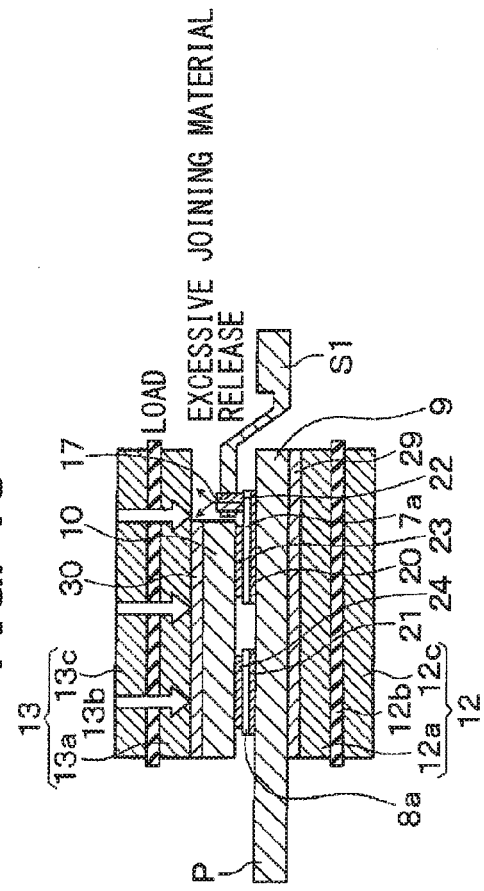
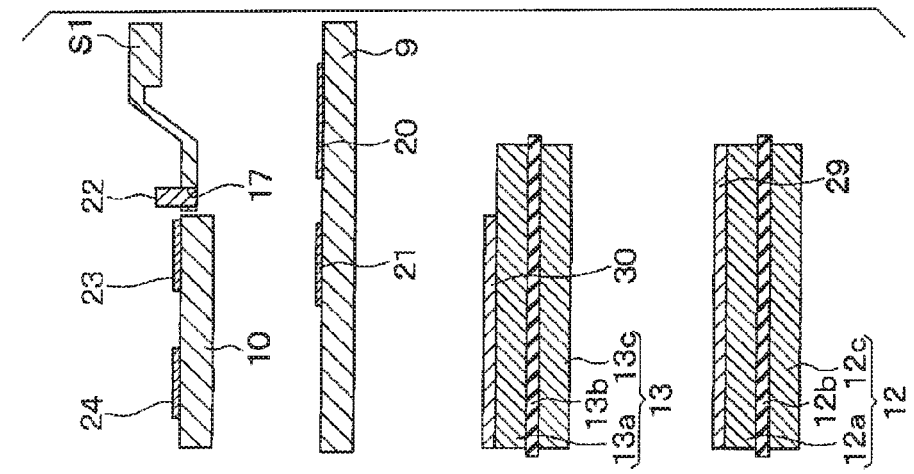

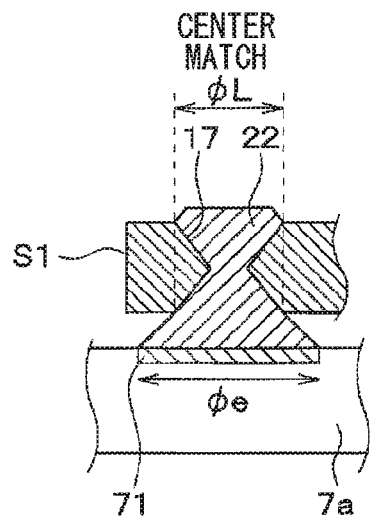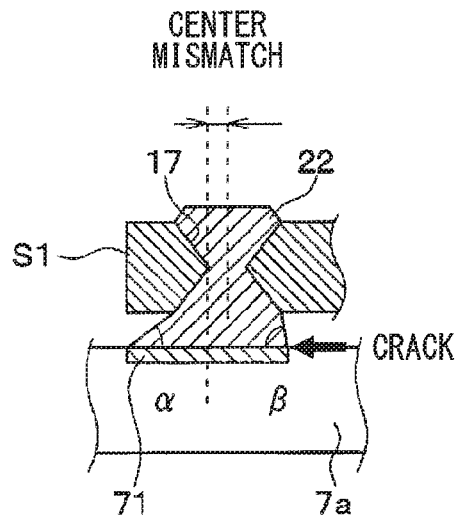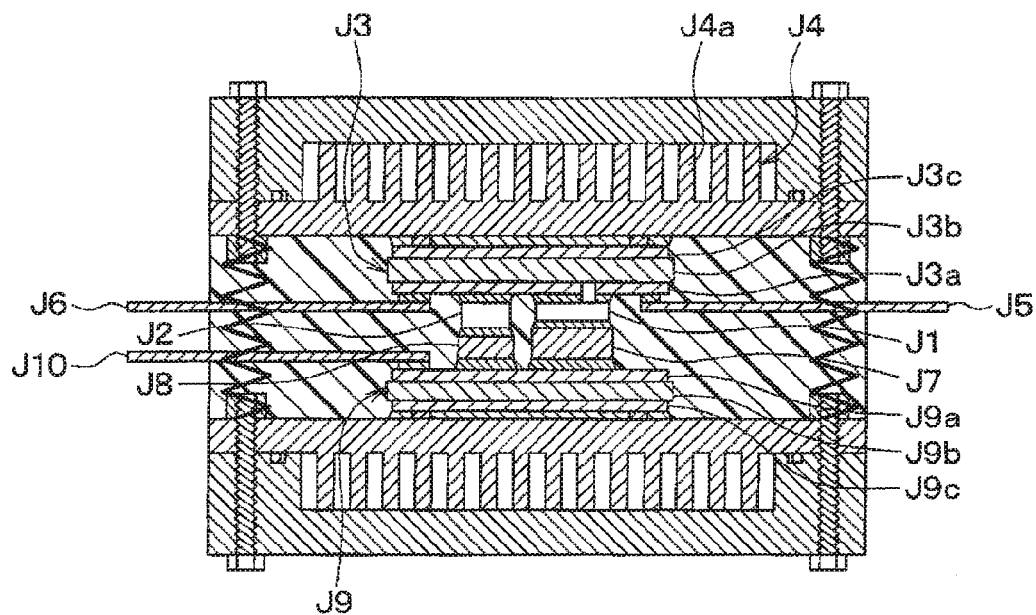

US 9,520,345 B2

SEMICONDUCTOR MODULE, SEMICONDUCTOR DEVICE HAVING SEMICONDUCTOR MODULE, AND METHOD OF MANUFACTURING SEMICONDUCTOR MODULE

CROSS REFERENCE TO RELATED APPLICATIONS

The present disclosure is a divisional application of U.S. utility application Ser. No. 14/235,571 filed on Jan. 28, 2014, which is a U.S. national stage application of PCT/JP2012/005062 filed on Aug. 9, 2012 and is based on Japanese Patent applications No. 2011-174776 filed on Aug. 10, 2011 and No. 2011-174777 filed on Aug. 10, 2011, the disclosures of which are incorporated herein by reference.

TECHNICAL FIELD

The present disclosure relates to a semiconductor module in which a heat radiation substrate and a semiconductor chip formed with a semiconductor power element that radiates heat through the heat radiation substrate are sealed with a resin and configured into an integral structure, and a semiconductor device having the semiconductor module.

BACKGROUND

Conventionally, a patent document 1 has proposed a semiconductor device in which a heat sink is fixed to a semiconductor module. The semiconductor module is provided by an integral structure in which a semiconductor chip formed with a semiconductor power element and a heat radiation substrate are sealed with a resin. The heat sink has fins and forms a cooling mechanism.

FIG. 20 is a cross-sectional view of the semiconductor device. As shown in FIG. 20, semiconductor chips J1, J2 are formed with semiconductor power elements. A heat radiation substrate J3 includes a copper foil J3a having a desired pattern, an insulated substrate J3b, and a copper foil J3c. The copper foil J3a of the heat radiation substrate J3 is joined to the semiconductor chips J1, J2. A heat sink J4 has fins J4a and is fixed to the copper foil J3c of the heat radiation substrate J3. The semiconductor chip J1 is formed with an insulated gate field effect transistor (hereinafter referred to as the IGBT) as the semiconductor power element. The semiconductor chip J2 is formed with a free-wheel diode (hereinafter referred to as the FWD) as the semiconductor power element.

Signal line electrodes of the semiconductor chip J1, which include a gate electrode, are connected to a lead frame J5 through the copper foil J3a. An emitter electrode of the semiconductor chip J1 and an anode electrode of the semiconductor chip J2 are connected to a lead frame J6 through the copper foil J3a. A heat radiation substrate J9b includes a copper foil 9a, an insulated substrate J9b and a copper foil J9c. Further, a collector electrode of the semiconductor chip J1 and a cathode electrode of the semiconductor chip J2 are connected to the copper foil 9a of the heat radiation substrate J9 through spacers J7, J8, which are made of conductive members. Thus, the collector electrode of the semiconductor chip J1 and the cathode electrode of the semiconductor chip J2 are connected to a lead frame J10 through the copper foil J9a.

Further, as another example, a semiconductor module provided by an integral structure in which a semiconductor chip formed with a semiconductor power element and a heat radiation substrate are sealed with a resin has been conventionally proposed (see, for example, a patent document 2).

FIG. 21 is a cross-sectional view of the semiconductor module. As shown in this figure, the semiconductor module includes a semiconductor chip J101 and a semiconductor chip J102, and the semiconductor chip J101 and the semiconductor chip J102 are sealed with a resin part J103. The semiconductor chip J101 is formed with an insulated gate field effect transistor (hereinafter referred to as the IGBT) as the semiconductor power element. The semiconductor chip J102 is formed with a free-wheel diode (hereinafter referred to as the FWD) as the semiconductor power element.

A portion between an emitter and a collector of the IGBT and a portion between an anode and a cathode of the FWD are connected in parallel. A signal line terminal J104 is connected to signal line electrodes including a gate electrode of the IGBT. A high-side terminal J105 connects to a collector electrode. A low-side terminal J106 connects to an emitter electrode. Electric connections to external parts are made as the signal line terminal J104, the high-side terminal J105, and the low-side terminal J106 are exposed from the resin part J103.

In particular, the signal line electrodes including the gate electrode of the IGBT are electrically connected to the signal line terminal J104 by a bonding wire J107 connecting between the semiconductor chip J101 and the signal line terminal J104. The collector electrode of the IGBT is directly connected to the high-side terminal J105 through a solder J108. The emitter electrode of the IGBT is connected to an electrode block J110 through a solder J109, and then is further connected to the low-side terminal J106 through a solder J111. An anode electrode of the FWD is connected to an electrode block J113 through a solder J112, and then is further connected to the low-side terminal J106 through a solder J114. Further, a cathode electrode of the FWD is directly connected to the high-side terminal J105 through a solder J115.

PATENT DOCUMENTS

Patent document 1: Japanese Patent Application Publication No. 2009-117428

Patent document 2: Japanese Patent No. 3719506

In the semiconductor device described in the patent document 1, however, the heat radiation substrate J3 is curved. Thus, it becomes difficult to join the copper foil J3a and the first and second semiconductor chips J1, J2, or to join the copper foil J3c and the heat sink J4.

FIG. 22A shows an enlarged view of the heat radiation substrate shown in FIG. 20, and FIG. 22B shows an enlarged cross-sectional view illustrating a state that the heat radiation substrate J3 is curved. As shown in FIG. 20 and FIG. 22A, the copper foil J3a of the heat radiation substrate J3 is patterned and divided into a portion that is connected to the signal line electrodes including the gate electrode of the first semiconductor chip J1, and a portion that is connected to the emitter electrode of the first semiconductor chip J1 or the anode electrode of the second semiconductor chip J2. The divided portions are insulated from each other. Therefore, since the patterns of the copper foils J3a, J3c do not have a symmetric structure between a front surface and a rear surface of the heat radiation substrate J3, the heat radiation plate J3 is curved when the temperature is lowered from a high temperature during manufacturing to a room temperature. According to an experimental result, a large curve such as 200 to 400 µm was confirmed. Therefore, as shown in FIG. 22B, the copper foil J3a cannot be joined to a bump J11 disposed on the signal line electrode of the first semiconductor chip J11. Even if the copper foil J3a can be joined to the bump J11, a joining between them is weak.

Further, even if the copper foil J3a is joined to the signal line electrode of the first semiconductor chip J11 and the emitter electrode of the semiconductor chip J1 or the anode electrode of the semiconductor chip J2, the copper foil J3c cannot be joined to the heat sink J4, and thus a heat resistance deteriorates.

On the other hand, in the conventional semiconductor module as described in the patent document 2, the signal line terminal J104 and the semiconductor chip J101 are connected through the bonding wire J107. However, the signal line terminal J104 and the low-side terminal J106 have different potentials. Therefore, it is necessary to provide some space between the low-side terminal J106 and the bonding wire J107, which connects between the signal line terminal J104 and the semiconductor chip J101, so as to avoid contact of the bonding wire J107 with the low-side terminal J106. For this reason, the electrode blocks J110, J113 are needed, and thus the number of parts increases.

Also, the wiring of the bonding wire J107 is needed, resulting in the increase in manufacturing steps. In particular, as a process of making electric connection, a die-bonding step is performed, and then a bonding step is performed. In the die-bonding step, the semiconductor chips J101, J102 are mounted on the high-side terminal J105 through the solders J108, J115, and the electrode blocks J110, J113 are disposed on the semiconductor chips J101, J102 through the solders J109, J112, and then a reflow process is performed. In the bonding step, the bonding wire J107 is wired. Further, the low-side terminal J106 on which the solders J111, J114 are disposed is prepared, and a die-bonding step is performed again. In the die-bonding step, the above-described unit made by the die-bonding step is turned up side down, mounted on the low-side terminal J106 on which the solders J111, J114 have been disposed, and then the reflow process is performed again. Therefore, it is necessary to have a plurality of steps, such as the die-bonding step→the bonding step→the die-bonding step, for making the electric connection, and thus the manufacturing process is complicated.

SUMMARY

The present disclosure is made in view of the foregoing issues, and it is a first object to provide a semiconductor module with a structure that can reduce the curving of a heat radiation substrate, and a semiconductor device having the semiconductor module. It is a second object to provide a semiconductor module that is capable of electrically connecting a signal line terminal and a power element without requiring a bonding, and a method of manufacturing the semiconductor module.

According to a first aspect of the present disclosure, in a semiconductor module, a first lead frame and a second lead frame are disposed on opposite surfaces of a semiconductor chip, a first heat radiation substrate is joined to the first lead frame, a second heat radiation substrate is joined to the second lead frame, and the first lead frame, the second lead frame, the semiconductor chip, the first heat radiation substrate and the second heat radiation substrate are resin-sealed in a resin part. Each of the first heat radiation substrate and the second heat radiation substrate includes a first conductive portion having a surface joined to the first or second lead frame, a second conductive portion having a surface exposed from the resin part, and an insulated substrate disposed between the first conductive portion and the second conductive portion. The first conductive portion and the second conductive portion have a solid structure without being divided, and are symmetric.

As described above, the semiconductor chip is directly connected to the first lead frame and the second lead frame, and is not connected to the first lead frame and the second lead frame through the first conductive portion of the first and second heat radiation substrates. Therefore, the first conductive portion can have the solid structure without being divided, and can be symmetric with the second conductive portion. As such, an occurrence of curving of the first and second heat radiation substrates due to the temperature decrease from a high temperature at a time of resin-sealing to a room temperature after the resin-sealing can be suppressed. Accordingly, connection between the semiconductor chip and the first and second lead frames, and connection between the first and second lead frames and the first and second heat radiation substrates enhance.

According to a second aspect of the present disclosure, in a semiconductor module, a first lead frame and a second lead frame are disposed on opposite surfaces of a first semiconductor chip, the second lead frame and a third lead frame are disposed on opposite surfaces of a second semiconductor chip, a first heat radiation substrate is joined to the first lead frame, second and third heat radiation substrates are joined to the second lead frame, a fourth heat radiation substrate is joined to the third lead frame, and the first to third lead frames, the first and second semiconductor chips, the first to fourth heat radiation substrates are resin-sealed in a resin part. Each of the first to fourth heat radiation substrates includes a first conductive portion having a surface joined to the first, second or third lead frame, a second conductive portion having a surface exposed from the resin part, and an insulated substrate disposed between the first conductive portion and the second conductive portion. The first conductive portion and the second conductive portion have a solid structure without being divided, and are symmetric.

As described above, also in the semiconductor module having the first and second semiconductor chips, the first and second semiconductor chips are directly connected to the first to third lead frames, and are not connected to the first to third lead frames through the first conductive portion of the first to fourth heat radiation substrates. Therefore, the first conductive portion can have the solid structure without being divided, and can be symmetric with the second conductive portion. As such, an occurrence of curving of the first to fourth heat radiation substrates due to the temperature decrease from a high temperature at a time of resin-sealing to a room temperature after the resin-sealing can be suppressed. Accordingly, connection between the first and second semiconductor chips and the first to third lead frames, and connection between the first to third lead frames and the first to fourth heat radiation substrates enhance.

According to a third aspect of the present disclosure, a semiconductor module includes a first lead frame, a second lead frame and a resin part. The first lead frame is connected to a rear surface electrode of a semiconductor chip and has a first terminal. The second lead frame includes a signal line terminal connected to a signal line electrode of the semiconductor chip, and a plate portion that is connected to a front surface electrode of the semiconductor chip, and from which a second terminal extends. The resin part seals the semiconductor chip, the first lead frame and the second lead frame such that the first terminal and the second terminal are exposed from the resin part. The signal line terminal and the signal line electrode are joined through a joining material having a bump.

As described above, the signal line terminal connected to a gate electrode is provided using the second lead frame joined to the front surface electrode of the semiconductor chip. Further, since the joining material is used, the signal line terminal is directly connected to the signal line electrode of the semiconductor chip without using a bonding wire. Therefore, the semiconductor module is produced without performing the bonding. Accordingly, since it is not necessary to perform a complicated process including die-bonding step→bonding step→die-bonding step, as a conventional process requiring bonding, a manufacturing process can be simplified.

For example, to manufacture the semiconductor module described above, the first lead frame is prepared, and a first joining material is placed on a portion of the first lead frame to which the semiconductor chip is to be connected. Also, the second lead frame is prepared. A second joining material is placed on a portion of the second lead frame to which the semiconductor chip is to be connected, and a third joining material is placed on a portion of the signal line terminal that is to be connected to the signal line terminal. The semiconductor chip is placed on the first joining material. The second lead frame is placed on the first lead frame on which the semiconductor chip has been placed through the first semiconductor chip such that the surface of the second lead frame on which the second and third joining materials have been placed faces the first lead frame. By a reflowing process, the first joining material and the rear surface electrode are joined to each other, the second joining material and the front surface electrode are joined to each other, and the third joining material and the signal line electrode are joined to each other. Further, after the reflowing process, the first lead frame, the second lead frame and the semiconductor chip are sealed with a resin such that the first terminal and the second terminal expose from the resin part. As the second lead frame, a lead frame in which a signal line terminal is extended on a side of a plate portion opposite to a second terminal to define a longitudinal direction in one direction, and a signal line terminal is spaced from the plate portion and connects to the plate portion through a frame portion of the plate portion is used. After the sealing with the resin, the frame portion is cut off to electrically insulate the signal line terminal and the plate portion from each other.

BRIEF DESCRIPTION OF THE DRAWINGS

The above and other objects, features and advantages of the present disclosure will become more apparent from the following detailed description made with reference to the accompanying drawings, in which:

FIGS. 2A-2C are diagrams illustrating the semiconductor module employed in the inverter, in which FIG. 2A is a view illustrating an upper layout, FIG. 2B is a cross-sectional view taken along a line IIB-IIB in FIG. 2A, and FIG. 2C is a cross-sectional view taken along a line IIC-IIC in FIG. 2A;

FIGS. 4A, 4B, 4C, and 4D are cross-sectional views illustrating a manufacturing process of the semiconductor module;

FIGS. 19A and 19B are cross-sectional views of the vicinity of an end of a signal line terminal of a semiconductor module according to a modification of the seventh embodiment;

FIG. 20 is a cross-sectional view of a semiconductor device having a conventional semiconductor module;

Figure 1:
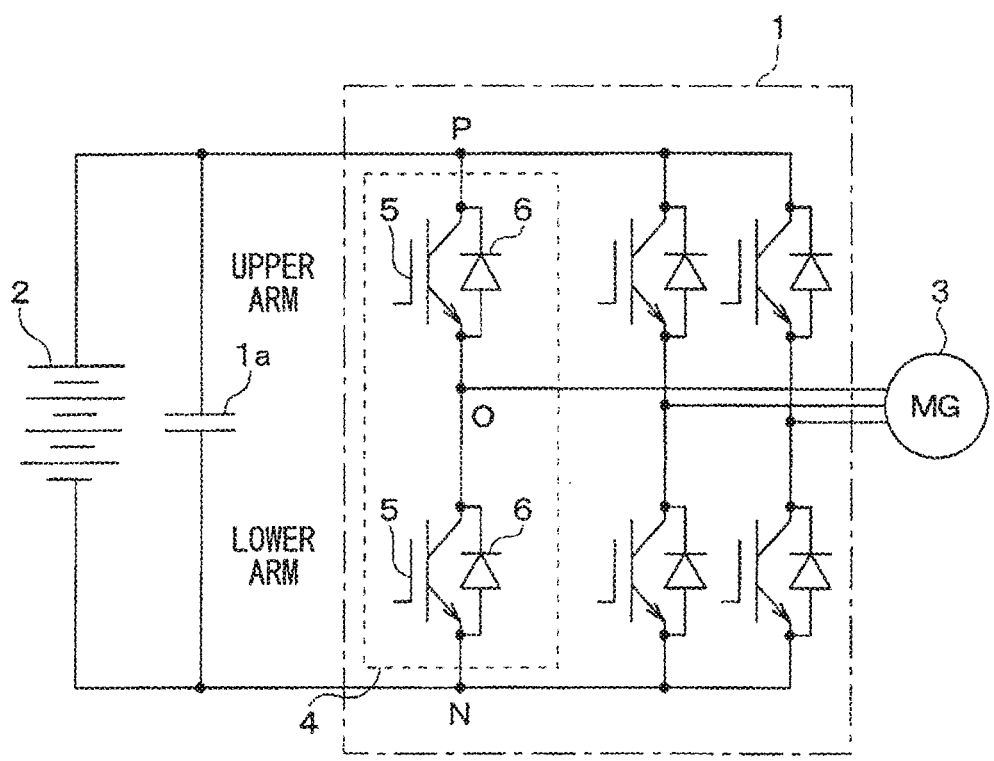
FIG. 1 is a circuit diagram of an inverter to which a semiconductor module according to a first embodiment of the present disclosure is adapted.

22B is an enlarged cross-sectional view illustrating a state of the heat radiation substrate curved.

DETAILED DESCRIPTION

Hereinafter, embodiments of the present disclosure will be described with reference to the drawings. Throughout the following embodiments, like or equivalent parts will be designated with like reference numbers in the drawings.

First Embodiment

A first embodiment of the present disclosure will be described. In the present embodiment, an inverter having a semiconductor module according to an embodiment of the present disclosure will be described as an example.

Figure 3:
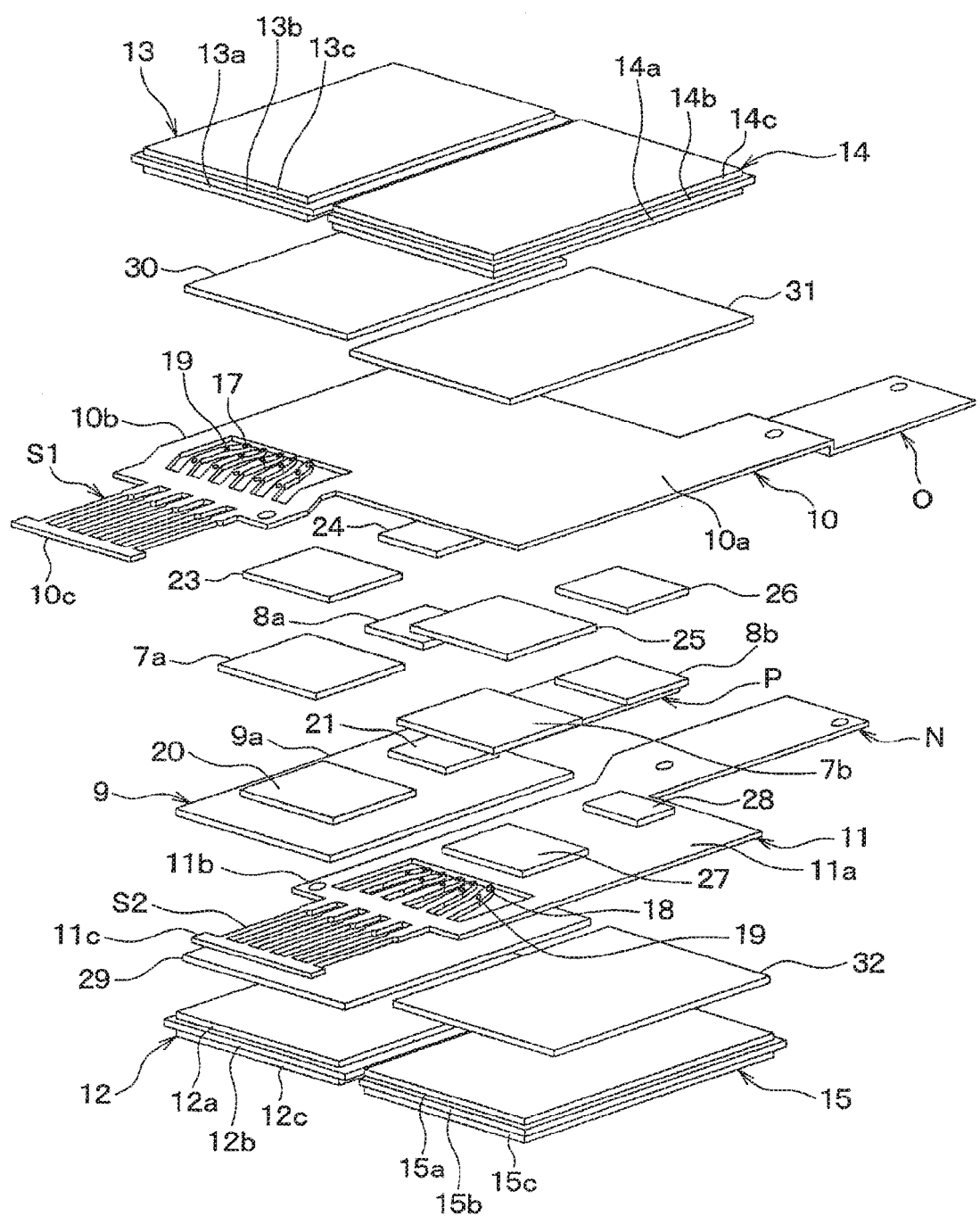
FIG. 3 is an exploded perspective view of the semiconductor module.

FIG. 1 is a circuit diagram of the inverter. FIGS. 2A-2C are diagrams illustrating the semiconductor module employed in the inverter, in which FIG. 2A is an upper layout view, FIG. 2B is a cross-sectional view taken along a line IIB-IIB in FIG. 2A, and FIG. 2C is a cross-sectional view taken along a line IIC-IIC in FIG. 2A. Also, FIG. 3 is an exploded perspective view of the semiconductor module.

As shown in FIG. 1, the inverter 1 is used to AC-drive a three-phase motor 3 as a load based on a DC power source 2. The inverter 1 is configured such that series connections, each including an upper arm and a lower arm connected in series, are connected in parallel for three phases, and a middle potential between the upper arm and the lower arm of the series connections is alternately applied to corresponding one of a U-phase, a V-phase and W-phase of the three-phase motor 3. In the inverter 1, one phase including the upper arm and the lower arm constitutes one semiconductor module 4. The inverter 1 is made of three semiconductor modules 4 shown in FIG. 2A and FIG. 3. For example, the inverter 1 is constructed of an integral unit of the three semiconductor modules 4. A capacitor 1a connected in parallel to the inverter 1 is a smoothing capacitor, and is inserted in order to reduce an inductance.

As shown in FIG. 1, each upper arm and each lower arm are, respectively, provided by an IGBT 5 and a FWD 6, which are semiconductor power elements. In the present embodiment, a semiconductor chip 7 in which the IGBT 5 is formed and a semiconductor chip 8 in which the FWD 6 is formed are separate chips (see FIGS. 2A, 2B, and 2C and FIG. 3), and a portion between an emitter and a collector of the IGBT 5 and a portion between an anode and a cathode of the FWD 6 are electrically connected to each other. In each of the semiconductor modules 4, a positive electrode terminal P, a negative electrode terminal N, an output terminal O, and signal line terminals S1, S2 of the upper arm are exposed outside, as shown in FIG. 2A. As a positive electrode of the DC power source 2, a negative electrode of the DC power source 2, and the three-phase motor 3 are connected to the positive electrode terminal P, the negative electrode terminal N and the output terminal O, respectively, a circuit structure shown in FIG. 1 is made. In such a structure, a gate voltage of the IGBT 5 is controlled by controlling voltages inputted to the signal line terminals S1, S2, and thus the inverter 1 is driven by controlling the gate voltage of the IGBT 5

Next, a detailed structure of the semiconductor module 4 of the inverter 1, which is configured as described above, will be described.

As shown in FIGS. 2B and 2C and FIG. 3, the semiconductor module 4 includes the semiconductor chips 7, 8, lead frames 9, 10, 11, heat radiation substrates 12-15, and the like, and these components are resin-sealed with a resin part 16 to form an integral structure.

The semiconductor chips 7, 8 are provided by a base material substrate made of Si, SiC, GaN or the like. The semiconductor chip 7 is composed of a semiconductor chip 7a in which the IGBT 5 of the upper arm is formed and a semiconductor chip 7b in which the IGBT 5 of the lower arm is formed. The semiconductor chip 8 is composed of a semiconductor chip 8a formed with the FWD 6 of the upper arm and a semiconductor chip 8b formed with the FWD 6 of the lower arm. In each of the semiconductor chips 7a, 7b, the IGBT5 is configured as a vertical-type element in which an electric current flows in a direction perpendicular to the substrate. In each of the semiconductor chips 8a, 8b, the FWD 6 is configured as a vertical-type element in which an electric current flows in a direction perpendicular to the substrate. For example, the semiconductor chips 7a, 7b have a structure in which signal line electrodes 71 including a gate electrode and an emitter electrode 72 are disposed on a front surface, and a collector electrode 73 is disposed on the whole of a rear surface. The semiconductor chips 8a, 8b has a structure in which an anode electrode 81 is formed on a front surface, and a cathode electrode 82 is formed on the whole of a rear surface.

In the case of the present embodiment, the left side in FIGS. 2A and 2B correspond to the upper arm, and the right side in FIGS. 2A and 2B correspond to the lower arm. Therefore, the semiconductor chip 7a is disposed such that the signal line electrodes 71 and the emitter electrode 72 face a front side of the paper and the collector electrode 73 faces a back side of the paper. The semiconductor chip 7b is inverted upside down with respect to the semiconductor chip 7a. The semiconductor chip 7b is disposed such that the signal line electrodes 71 and the emitter electrode 72 face the back side of the paper and the collector electrode 73 faces the front side of the paper. Likewise, the semiconductor chip 8a is disposed such that an anode electrode faces the front side of the paper and a cathode electrode faces the back side of the paper. The semiconductor chip 8b is disposed such that a cathode electrode faces the front side of the paper and an anode electrode faces the back side of the paper. As shown in FIG. 2A, the semiconductor chips 7a, 8a of the upper arm are aligned in the up and down direction of the paper, and the semiconductor chips 7b, 8b of the lower arm are aligned in the up and down direction of the paper.

The lead frames 9-11 include the lead frame 9 having the positive electrode terminal P, the lead frame 10 having the output terminal O and the signal line terminals S1 connected to the semiconductor chip 7a of the upper arm, the lead frame 11 having the negative electrode terminal N and the signal line terminals S2 connected to the semiconductor chip 7a of the upper arm.

The lead frame 9 is provided by a plate-shaped conductive member. The lead frame 9 is provided by a metal plate that is made of Cu, Al, Fe or the like as a main material and has an area to be connected to the heat radiation substrate 12. For example, the lead frame 9 is made by press working of a metal plate. The semiconductor chips 7a, 8a of the upper arm are mounted on the lead frame 9. The whole of the surface of the semiconductor chip 7a on which the collector electrode 73 is formed and the whole of the surface of the semiconductor chip 8a on which the cathode electrode 82 is formed are joined to the lead frame 9. The lead frame 9 has the positive electrode terminal P. The positive electrode terminal P extends from a rectangular plate portion 9a in one direction along an alignment direction of the semiconductor chips 7a, 8a, and is extended to the outside of the resin part 16.

The lead frame 10 is also provided by a plate-shaped conductive member. The lead frame 10 is provided by a metal plate that is made of Cu, Al, Fe or the like as a main material and has an area to be connected to the heat radiation substrates 13, 14. For example, the lead frame 10 is made by press working of a metal plate. All of the semiconductor chips 7a, 8a of the upper arm and the semiconductor chips 7b, 8b of the lower arm are connected to the lead frame 10. In particular, the emitter electrode 72 and the signal line electrodes 71, including the gate electrode, of the semiconductor chip 7a of the upper arm are connected to the lead frame. The anode electrode of the semiconductor chip 8a of the upper arm is connected to the lead frame 10. The collector electrode 73 of the semiconductor chip 7b of the lower arm is connected to the lead frame 10. Further, the cathode electrode 82 of the semiconductor chip 8b of the lower arm is connected to the lead frame 10.

As shown in FIG. 2C, in regard to the upper arm, the signal line electrodes 71, including the gate electrode, of the semiconductor chip 7a are connected to the lead frame 10 through a joining material 22, and the emitter electrode 72 of the semiconductor chip 7a is connected to the lead frame 10 through a joining material 23. Also, the anode electrode 81 of the semiconductor chip 8a is connected to the lead frame 10 through a joining material 24. As shown in FIG. 3, in regard to the lower arm, the collector electrode 73 of the semiconductor chip 7b is connected to the lead frame 10 through a joining material 25, and the cathode electrode 82 of the semiconductor chip 8b is joined to the lead frame 10 through a joining material 26.

The lead frame 10 has the output terminal O and the signal line terminals S1. The output terminal O and the signal line terminals S1 are drawn to the outside of the resin part 16.

In the lead frame 10, the output terminal O extends from the rectangular plate portion 10a, which has a wide area and to which the emitter electrode 72 of the semiconductor chip 7a, the anode electrode 81 of the semiconductor chip 8a, the collector electrode 73 of the semiconductor chip 7b, and the cathode electrode 82 of the semiconductor chip 8b are connected. In particular, the output terminal O extends from a corner at which the semiconductor chip 8b is disposed, among four corners of the rectangular plate portion 10a, in the same direction as the positive electrode terminal P. The output terminal O is bent at a mid-portion thereof to be at the same height as the positive electrode terminal P of the lead frame 9.

The signal line terminals S1 are located, among the four corner of the rectangular plate portion 10a, at a corner that is diagonal to the corner at which the output terminal O is disposed. A plurality of the signal line terminals S1 is provided. The signal line terminals S1 have a structure that can be separated from the rectangular plate portion 10a at a finished product. Namely, each of the signal line terminals S1 has a longitudinal direction in the alignment direction of the semiconductor chips 7a, 8a. The end of the signal line terminal S1 adjacent to the rectangular plate portion 10a is spaced from the rectangular plate portion 10a. The signal line terminal S1 connects to a frame portion 10b extending from the rectangular plate portion 10a at a mid-position with respect to the longitudinal direction thereof. As the frame portion 10b is finally cut and separated, the signal line terminals S1 are separated (electrically insulated) from the rectangular plate portion 10a. The ends of the signal line terminals S1 opposite to the rectangular plate portion 10a are connected through a frame portion 10c. The frame portion 10c is also finally cut and separated. Therefore, the signal line terminals S1 are finally separated (electrically insulated) from each other.

The end of the signal line terminal S1 adjacent to the rectangular plate portion 10a has a thickness greater than that of the rectangular plate portion 10a. In particular, as shown in FIG. 2C, the end of the signal line terminal S1 adjacent to the rectangular plate portion 10a has a surface that is coplanar with the surface of the rectangular plate portion 10a on a side adjacent to the semiconductor chip 7a. The opposite surface of the end of the signal line terminal S1 is located at a position lower than the rectangular plate portion 10a. Therefore, a space is provided between the signal line terminals S1 and the heat radiation substrate 13, and thus insulation between the signal line terminals S1 and the heat radiation substrate 13 can be ensured.

Further, the end of the signal line terminal S1 adjacent to the rectangular plate portion 10a, that is, the end of the signal line terminal S1 connected to the signal line electrodes 71, including the gate electrode, of the semiconductor chip 7a is formed with a cylindrical through hole 17 that extends through from a front surface to a rear surface. The joining material 22 is entered in the through hole 17. Since the joining material 22 is entered in the through hole 17, the signal line terminal S1 is securely joined. Also, the joining material 22 is hardly removed from the through hole 17 because the through hole 17 serves as an anchor. Therefore, the joining between the joining material 22 and the signal line terminal S1 can be further strengthened. In addition, the signal line terminal S1 is bent at the mid-position with respect to the longitudinal direction thereof, and the end of the signal line terminal S1 opposite to the rectangular plate portion 10a is at the same height as the lead frame 9.

A through hole 19 is further formed in the signal line terminal S1 at a position further from the semiconductor chip 7a than the through hole 17. Since the resin can flow through the through hole 19 when a resin-sealing of the resin part 16 is performed, a fileability (flowability) of the resin can be enhanced.

The lead frame 11 is also provided by a plate-shaped conductive member. The lead frame 10 is provided by a metal plate that is made of Cu, Al, Fe or the like as a main material and has an area to be connected to the heat radiation substrate 15. For example, the lead frame 11 is made by press working of a metal plate. The semiconductor chips 7b, 8b of the lower arms are connected to the lead frame 11. In particular, in regard to the semiconductor chip 7b, the signal line electrodes 71 including the gate electrode are joined to the lead frame 11 through a non-illustrated joining material, and the emitter electrode 72 is connected to the lead frame 11 through a joining material 27. In regard to the semiconductor chip 8b, the anode electrode 81 is connected to the lead frame 11 through a joining material 28.

The lead frame 11 has the negative electrode terminal N and the signal line terminals S2. The negative electrode terminal N and the signal line terminals S2 are extended to the outside of the resin part 16.

The negative electrode terminal N extends from a rectangular plate portion 11a of the lead frame 11 that has a wide area and to which the emitter electrode 72 of the semiconductor chip 7b and the anode electrode 81 of the semiconductor chip 8b are connected. In particular, the negative electrode terminal N is extended in a direction along the alignment direction of the semiconductor chips 7b, 8b, at a position between the positive electrode terminal P of the lead frame 9 and the output terminal O of the lead frame 10, and is extended to the outside of the resin part 16.

The signal line terminals S2 are disposed at a portion of the rectangular plate portion 11a opposite to the negative electrode terminal N. A plurality of the signal line electrodes S2 is provided. The signal line electrodes S2 have a structure that can be separated from the rectangular plate portion 11a in the final product. Namely, each of the signal line terminals S2 has a longitudinal direction in the alignment direction of the semiconductor chips 7b, 8b. The end of the signal line terminal S2 adjacent to the rectangular plate portion 11a is spaced from the rectangular plate portion 11a. The signal line terminal S2 connects to a frame portion 11b extending from the rectangular plate portion 10a at a mid-position with respect to the longitudinal direction thereof. As the frame portion 11b is finally cut and separated, the signal line terminals S2 are separated (electrically insulated) from the rectangular plate portion 11a. The ends of the signal line terminals S2 opposite to the rectangular plate portion 11a are connected through a frame portion 11c. The frame portion 11c is also finally cut and separated. Therefore, the signal line terminals S2 are finally separated (electrically insulated) from each other.

A through hole 18 is formed at the end of the signal line terminals S2 adjacent to the rectangular plate portion 11a, that is, the portion of the signal line terminals S2 connected to the signal line electrodes 71, including the gate electrode, of the semiconductor chip 7b. The through hole 18 passes through the signal line terminal S2 from a front surface and a rear surface. The through hole 18 has a similar function to the through hole 17 of the signal line terminal S1. The non-illustrated joining material connecting between the signal line terminal S2 and the signal line electrode 71 is entered in the through hole 18.

Although not illustrated in the cross-section, the portion of the signal line terminals S2 connected to the signal line electrodes 71, including the gate electrode, that is, the portion of the signal line terminals S2 adjacent to the rectangular plate portion 11a has a thickness smaller than that of the rectangular plate portion 11a, similar to the signal line terminals S1. Further, the through hole 19 is formed in the signal line terminal S2 at a position further from the semiconductor chip 7a than the through hole 18 so as to improve a fillability (flowability) of the resin at the time of the resin-sealing.

The heat radiation substrates 12-15 have a rectangular plate shape. The heat radiation substrates 12-15 are joined to the surfaces of the lead frames 9-11 on the sides opposite to the semiconductor chips 7, 8 to radiate heat generated from the semiconductor chips 7a, 7b and the like. Each of the heat radiation substrates 12-15 has a conductive portion 12a-15a, an insulated substrate 12b-15b, and a conductive portion 12c-15c. The conductive portion 12a-15a and the conductive portion 12c-15c of each of the heat radiation substrates 12-15 have a solid structure that is not divided relative to the insulated substrate 12b-15b, and are formed symmetric with respect to the insulated substrate 12b-15b. Namely, when two sides of the rectangular plated-shaped heat radiation substrate 12-15, which intersect with each other, are defined as an X axis and a Y axis, the conductive portion 12a-15a and the conductive portion 12c-15c typically have the symmetric shape with respect to both of the X axis and the Y axis, and have the same thickness. Although it is preferable that the conductive portion 12a-15a and the conductive portion 12c-15c have typically the exactly symmetrical shape, arrangement positions of the conductive portion 12a-15a and the conductive portion 12c-15c may be accorded such that the areas thereof overlap at least 80%, preferably, 95% or more, when viewed along a direction normal to the heat radiation substrate 12-15.

The conductive portion 12a-15a is a portion disposed adjacent to the lead frame 9-11 on the insulated substrate 12b-15b. The conductive portions 12a-15a are connected to the lead frames 9-11 through joining materials 29, 30, 31, 32, respectively. The insulated substrate 12b-15b is arranged between the conductive portion 12a-15a and the conductive portion 12c-15c to insulate between the conductive portion 12a-15a and the conductive portion 12c-15c. The conductive portion 12c-15c is disposed opposite to the lead frame 9-11 with respect to the insulated substrate 12b-15b, and the surface of the conductive portion 12c-15c opposite to the insulated substrate 12b-15b is exposed from the resin part 16. The conductive portion 12a-15a is made of a material containing Cu, Al, Fe or the like as a main material. For example, the conductive portion 12a-15a is made of a Cu thick film having a thickness of 0.3 to 0.8 mm. For example, the insulated substrate 12b-15b is made of SiN, AlN, $Al_2O_3$ or the like, and has a thickness of 0.1 to 0.5 mm.

The resin part 16 is made of a material having a coefficient of linear expansion lower than that of the conductive portions 12a-15a, 12c-15c of the heat radiation substrates 12-15. By this configuration, expansion and contraction of the conductive portions 12a-15a, 12c-15c can be suppressed by the resin part 16. Therefore, the curving of the heat radiation substrates 12-15 can be further suppressed.

The semiconductor module 4 of the present embodiment is configured as described hereinabove. Next, a manufacturing method of the semiconductor module 4 configured as described hereinabove will be described. FIGS. 4A, 4B, 4C, and 4D are cross-sectional views illustrating a manufacturing process of the semiconductor module 4 according to the present embodiment, and the cross-sectional views correspond to the cross-section shown in FIG. 2C.

[Step Shown in FIG. 4A]

The lead frames 9-11 are prepared such as by pressing a metal plate. (In the figure, only the lead frames 9, 10 are illustrated. Also in the subsequent figures, although only the cross-section corresponding to FIG. 2C is illustrated, each step will be explained also for the portions other than the cross-section illustrated in FIG. 2C) Further, the joining materials 20, 21, 27, 28 are placed on portions of the surfaces of the lead frames 9, 11 where the semiconductor chips 7a, 7b, 8a, 8b are to be mounted. Also, the solders 23-26 are placed on portions of the surface of the lead frame 10 corresponding to the semiconductor chips 7a, 7b, 8a, 8b. The joining material 22 is placed on the signal line terminals S1. The non-illustrated joining material is also placed on the signal line terminals S2. Further, the heat radiation substrates 12-15 are prepared (in the figure, only the heat radiation substrates 12, 13 are illustrated). The joining materials 29-32 are placed on portions of the heat radiations substrates 12-15 corresponding to the connecting portions with the lead frames 9-11.

For example, the joining materials 20, 21, 23-26, 29-32 are formed by applying a solid material such as a solder foil, or by applying a sintered Ag paste or the like such as by a printing technique or a dispensing technique. The joining material 22 for the signal line terminals S1 and the joining material for the signal line terminals S2 are provided by depositing a solder ball or the like to corresponding portions, and primarily fixing them through a reflowing process. The joining materials 20, 21, 23-26, 29-32 may be preliminarily fixed at the same time as this reflowing process.

The joining material 22 for the signal line terminals S1 and the joining material for the signal line terminals S2 are provided by materials having melting temperatures lower (preferably, lower by approximately 10° C.) than that of the joining materials 20, 21, 23-28, and are higher than the joining materials 20, 21, 23-28. For example, the joining material 22 for the signal line terminals S1 and the joining material for the signal line terminals S2 are made of an SnAgCu-based material (melting temperature of 218° C.), and the joining materials 20, 21, 23-28 are made of a SnCuNi-based material (melting temperature of 228° C.). The height and the melting temperature of the joining materials 29-32 are not particularly limited, but the joining materials 29-32 are made of a SnCuNi-based material (melting temperature of 228° C.).

[Step Shown in FIG. 4B]

Each of the heat radiation substrates 12-15 is joined to corresponding lead frame 9-11 through the joining material 29-32. After the lead frame 9 to which the heat radiation substrate 12 has been joined and the lead frame 11 to which the heat radiation substrate 15 has been joined are arranged next to each other, the semiconductor chips 7a, 7b, 8a, 8b are placed on the joining materials 20, 21, 27, 28. Thereafter, the lead frame 10 to which the heat radiation substrates 13, 14 have been joined is inversed, that is, oriented such that the surface of the lead frame 10 faces the lead frames 9, 11, and is placed on the semiconductor chips 7a, 7b, 8a, 8b.

[Step Shown in FIG. 4C]

A reflowing process is performed. As shown in FIG. 4B, when the lead frame 10 to which the heat radiation substrates 13, 14 have been joined is placed, since the joining material 22 for the signal line terminals S1 and the joining material for the signal line terminals S2 are higher than the joining materials 20, 21, 23-28, the lead frame 10 is tilted, and becomes unstable.

However, when the joining materials 20-32 are melted by the reflowing process, the tilting of the lead frame 10 is corrected and the lead frame 10 is leveled. Therefore, the lead frame 10 becomes stable. Particularly, as described above, in the case where the joining material 22 is made of the material having the melting temperature lower than those of the joining materials 20, 21, 23-28, the joining material 22, which causes the lead frame 10 to tilt, is firstly melted and the load is applied. Therefore, the height of the joining material 22 can be made the same height as the joining materials 20, 21, 23-28. In the case of the present embodiment, since the signal line terminals S1, S2 are formed with the through holes 17, 18, an excessive amount of the joining material 22 can be released into the through holes 17, 18. Therefore, the height of the joining material 22 can be further made to the same height as the joining materials 20, 21, 23-28. Further, after the height of the joining materials 20-28 can be made the same, the temperature of the reflowing process is further raised. Thus, all the joining materials 20-32 are melted, and the respective portions are joined by the joining materials 20-32.

[Step Shown in FIG. 4D]

A primer process may be performed, if needed. Thereafter, the components joined by the joining materials 20-32 are placed in a non-illustrated molding die, and a resin injection is performed so that the components are sealed with the resin part 16. In this way, the semiconductor module shown in FIGS. 2A, 2B, and 2C is produced. Thereafter, unnecessary portions such as the frame portions 10b, 10c, 11b, 11c are cut. In this case, since the cut portions of the frame portions 10b, 11b are exposed from the resin part 16, it is preferable to cover the exposed portions with an insulating resin material that can be cured at a low temperature. In this way, the semiconductor module 4 according to the present embodiment is completed.

According to the semiconductor module 4 and the manufacturing method of the semiconductor module 4 described hereinabove, the following effects can be achieved.

(1) In the present embodiment, the heat radiation substrates 12-15 are connected to the lead frames 9-11. The semiconductor chips 7a, 7b, 8a, 8b are directly connected to the lead frames 9-11, but are not connected to the lead frames 9-11 through the conductive portions 12a-15a of the heat radiation substrates 12-15. Therefore, the following effects can be achieved. The effects will be described with reference to FIGS. 5A and 5B.

Figure 5B:
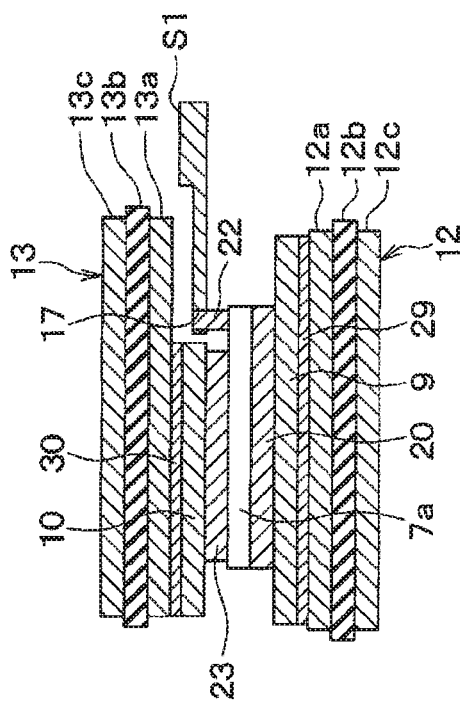
FIG. 5B is a cross-sectional view of a vicinity of a semiconductor chip, a lead frame and a heat radiation substrate of the semiconductor module according to the first embodiment.
Figure 5A:
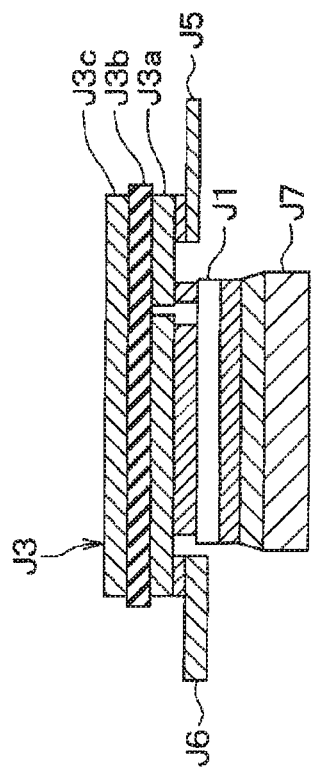
FIG. 5A is an enlarged view of a connecting part between a conventional semiconductor chip and a heat radiation substrate.

FIG. 5A is an enlarged view of a conventional connecting portion between the semiconductor chip J1 and the heat radiation substrate J3, and FIG. 5B is a cross-sectional view of the vicinity of the semiconductor chip 7a and the lead frame 10 of the semiconductor module 4 according to the present embodiment.

As shown in FIG. 5A, in the conventional structure, the signal line electrodes of the semiconductor chip J1 are connected to the lead frame J5 though the copper foil J3a of the heat radiation substrate J3, and the emitter electrode is connected to the lead frame J6 also through the copper foil J3a of the heat radiation substrate J3. Therefore, it is necessary to divide the copper foil J3a in a divided structure, and thus the copper foil J3a and the copper foil J3c disposed on the front and rear surfaces of the insulated substrate J3b do not have a symmetric pattern. As a result, the heat radiation substrate J3 is curved.

In the present embodiment, on the other hand, it is not configured that the semiconductor chip 7a is connected to the lead frame 10 through the conductive portions 12a, 13a of the heat radiation substrates 12, 13, as shown in FIG. 5B. Therefore, the conductive portions 12a, 13a can have a solid structure without being divided. Accordingly, it is less likely that the heat radiation substrates 12, 13 will be curved when the temperature is reduced from a high temperature to the room temperature after the resin-sealing at a high temperature. Therefore, the connection between the semiconductor chip 7a and the lead frames 9, 10, and the connection between the lead frames 9, 10 and the heat radiation substrates 12, 13 can be properly performed. In the example of FIG. 5B, although the heat radiation substrates 12, 13 are exemplified, the same effect can be achieved also in regard to the heat radiation substrates 14, 15.

(2) In the conventional semiconductor module, the component structure on opposite sides of the semiconductor chip J1, J2 is not symmetric. Namely, as shown in FIG. 20, although the signal line electrodes including the gate electrode of the semiconductor chip J1, the side of the semiconductor chip J1 adjacent to the emitter electrode, and the side of the semiconductor chip J2 adjacent to the anode electrode are directly connected to the heat radiation substrate J3, the opposite sides of the semiconductor chips J1, J2 are connected to the heat radiation substrate J9 though the spacer J7, J8. Therefore, the curving occurs resulting from the asymmetry where the components are not disposed symmetric on the opposite sides of the semiconductor chip J1, J2.

In the semiconductor module 4 according to the present embodiment, on the other hand, the components are disposed symmetric on the opposite sides of the semiconductor chip 7, 8. Therefore, the curving due to the asymmetry can be reduced. In the case of the present embodiment, particularly, the conductive portion 13a of the heat radiation substrate 13 can have a solid structure. Since the heat radiation substrate 12 and the heat radiation substrate 13 can have the same structure, the components can be disposed further symmetrically on the opposite sides of the semiconductor chip 7, 8. Accordingly, the curving due to the asymmetry can be further reduced.

Further, in the case of the semiconductor module 4 according to the present embodiment, in view of the function, the heat radiation substrates 13, 14 connected to the lead frame 10 may be provided by a single substrate, in place of separate substrates. Also, the heat radiation substrates 12, 15 may be provided by a single substrate, in place of separate substrates, as long as the conductive portions 12a, 15a are insulated and separated and configured to have different potentials. However, since the heat radiation substrates 12-15 are separate substrates, the structures on the opposite sides of the semiconductor chip 7, 8 can be configured symmetric. Therefore, the curving due to the asymmetry described above can be reduced.

Figure 6:
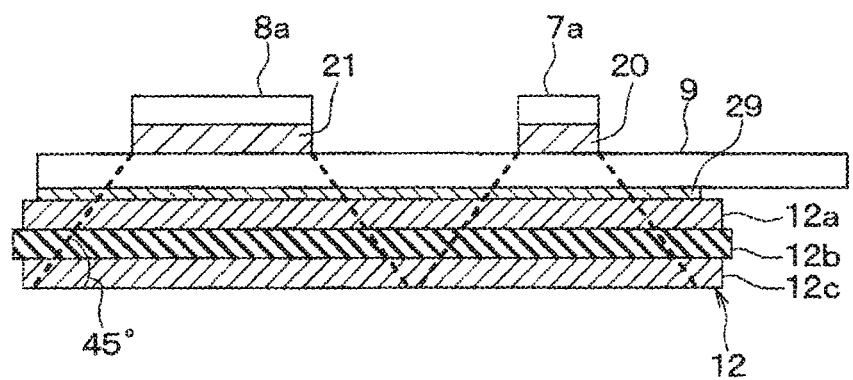
FIG. 6 is a diagram illustrating a range to which heat from the semiconductor chip expands.

In the case where the heat radiation substrates 12-15 are separate substrates, it is preferable that each of the heat radiation substrates 12-15 is a single piece having a minimum size. Namely, the curving increases with an increase in size of each heat radiation substrate 12-15. Therefore, when the size of the heat radiation substrates 12-15 is reduced as small as possible, the curving can be reduced. Further, the space to which the resin flows is increased, as compared with a case where the heat radiation substrates are formed into a single substrate. Therefore, it is possible to enhance the flowability (flowing-in property) of the resin. With this, it is possible to further improve the fillability of the resin. However, since the heat radiation substrates 12-15 radiate heat generated from the semiconductor chips 7, 8, the size of the heat radiation substrates 12-15 is preferably determined to the size that does not cause heat interference considering the range of heat diffusion from the semiconductor chips 7, 8. FIG. 6 is a schematic diagram illustrating the range of heat diffusion from the semiconductor chips 7, 8. As shown in this figure, the heat diffuses in the angle of 45° from the semiconductor chip 7, 8. Considering this, the size of the heat radiation substrates 12-15 is determined so that the range of heat diffusion does not overlap.

(3) In the semiconductor module 4 of the present embodiment, the positive electrode P, the negative electrode N and the output terminal O are arranged in this order, and the positive electrode terminal P and the negative electrode terminal N are arranged next to each other. As shown in FIG. 1, the smoothing capacitor 1a is inserted to be parallel with the inverter 1 so as to reduce the inductance. To further reduce the inductance, it is preferable to arrange the positive electrode terminal P and the negative electrode terminal N adjacent to each other.

Figure 7:
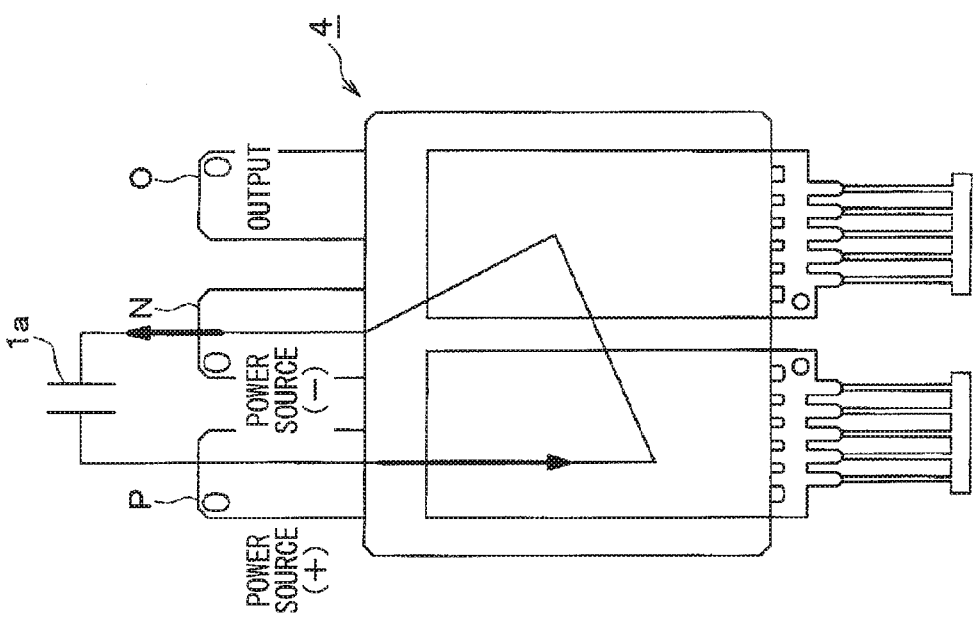
FIGS. 7A and 7B are diagrams illustrating front layouts of the semiconductor module in cases where arrangements of a positive electrode terminal, a negative electrode terminal and an output terminal are modified.

FIGS. 7A and 7B are views illustrating front layouts of the semiconductor module 4 when the arrangement of the positive electrode terminal P, the negative electrode terminal N and the output terminal O is modified. As shown in FIG. 7B, when the positive electrode terminal P, the output terminal O and the negative electrode terminal N are arranged in this order, the distance between the positive electrode terminal P and the output terminal O increases. Therefore, an area surrounded by a closed loop of the power source shown in the figure is increased, and the inductance L is made relatively large. On the other hand, as shown in FIG. 7A, in the structure where the positive electrode terminal P and the negative electrode terminal N are arranged next to each other, the distance between the positive electrode terminal P and the negative electrode terminal N reduces. Therefore, the area surrounded by the closed loop of the power source shown in the figure is reduced, and the inductance L can be made relatively small. This is because the magnetic fluxes are cancelled as the electric currents flow in opposite directions at near positions, resulting in the decrease of the inductance.

(4) In the present embodiment, the signal line terminals S1, S2 to be connected to the signal line electrodes 71 including the gate electrode are provided using the lead frames 10, 11 that are joined to the emitter electrodes 72 of the semiconductor chips 7a, 7b. Further, since the joining material 22 is used, the signal line terminals S1, S2 are directly joined to the signal line electrodes 71 of the semiconductor chips 7a, 7b without using bonding wires. Therefore, the semiconductor module 4 can be provided by the structure without requiring the bonding. Since the complicated process, such as die-bonding step→bonding step-→die-bonding step, which was performed in a conventional process with the bonding, is not required, the manufacturing process can be simplified.

(5) In the present embodiment, the portions of the signal line terminals S1, S2 to be connected to the semiconductor chips 7a, 7b have the thickness smaller than the thickness of the rectangular plate portions 10a, 11a of the lead frames 10, 11. Therefore, since the space between the signal line terminals S1 and the heat radiation substrate 13 and the space between the signal line terminals S2 and the heat radiation substrate 15 can be increased, an occurrence of short-circuit between them can be securely restricted.

Further, since the thickness of the signal line terminals S1, S2 is reduced, the stress reduction effect and the effect of improving the flowability of the resin during the resin-sealing in the manufacturing process can be achieved. These effects will be described with reference to FIG. 8 and FIGS. 9A and 9B.

Figure 8:
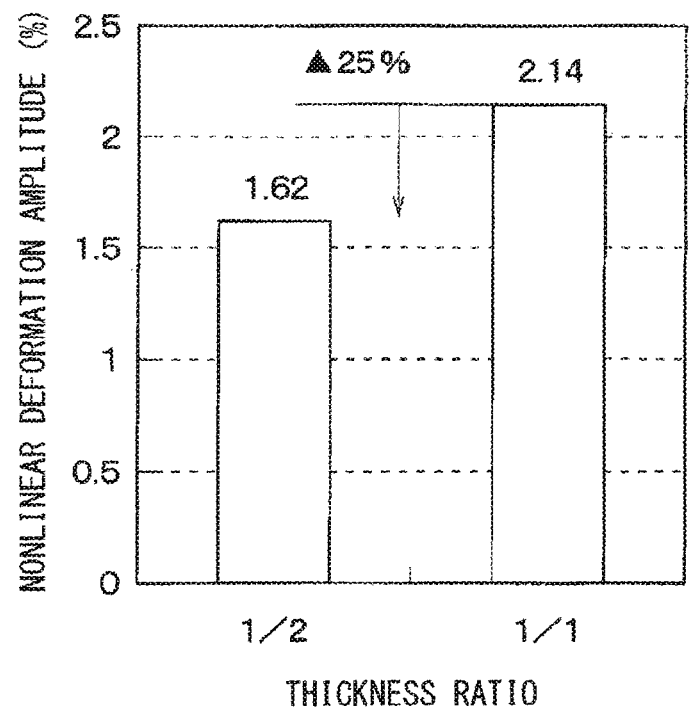
FIG. 8 is a graph illustrating investigation results about a non-linear deformation amplitude (%) of a case where the thickness of a signal line terminal is the same as the thickness of a rectangular plate portion of a lead frame and a case where the thickness of the signal line terminal is ½ of the thickness of the rectangular plate portion of the lead frame.

FIG. 8 is a graph illustrating examination results of a nonlinear deformation amplitude (%) of a case where the thickness of the signal line terminals S1 is the same as the thickness of the rectangular plate portion 10a of the lead frame 10, and of a case where the thickness of the signal line terminals S1 is ½ of the thickness of the rectangular plate portion 10a of the lead frame 10. In this case, the thickness of the rectangular plate portion 10a of the lead frame 10 is 0.5 mm. The amplitude is simulated for the case where the thickness of the signal line terminals S1 is the same as the thickness of the rectangular plate portion 10a, and for the case where the thickness of the signal line terminals S1 is ½ of the thickness of the rectangular plate portion 10a. The physical-property values in other portions are common.

As shown in this figure, it is appreciated that, when the thickness of the signal line terminals S1 is smaller than the thickness of the rectangular plate portion 10a, the nonlinear deformation amplitude reduces by 25% from 2.14 to 1.62, as compared with the case where the thickness of the signal line terminals S1 is the same as the thickness of the rectangular plate portion 10a. In this simulation, the nonlinear deformation amplitude is examined with respect to the thickness of the signal line terminals S1 and the thickness of the rectangular plate portion 10a of the lead frame 10. The similar result is obtained with respect to the thickness of the signal line terminals S2 and the thickness of the rectangular plate portion 11a of the lead frame 11. Therefore, the stress reduction effect can be exerted by reducing the thickness of the signal line terminals S1, S2 smaller than the thickness of the rectangular plate portions 10a, 11a of the lead frames 10, 11.

Figure 9A:
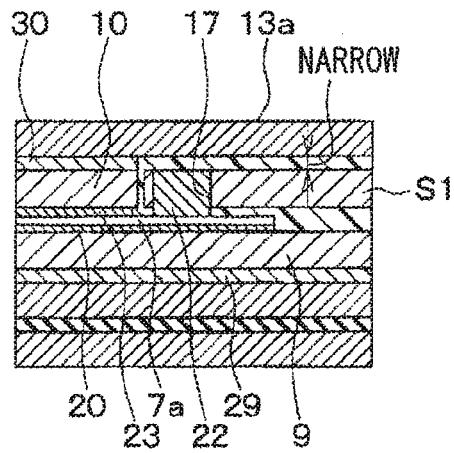
FIG. 9A is a view illustrating a cross-section of the case where the thickness of the signal line terminal is the same as the thickness of the square plate portion of the lead frame.
Figure 9B:
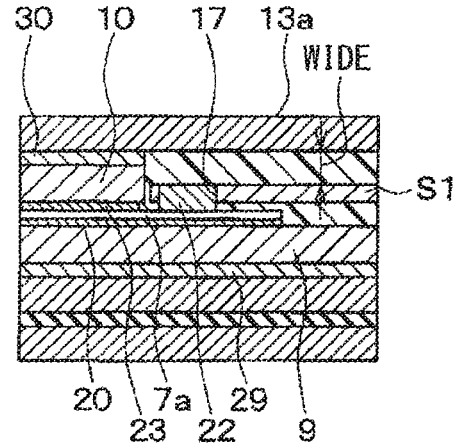
FIG. 9B is a view illustrating a cross-section of the case where the thickness of the signal line terminal is smaller than the thickness of the square plate portion of the leaf frame.

FIG. 9A is a view illustrating a cross-section when the thickness of the signal line terminal S1, S2 is the same as the thickness of the rectangular plate portion 10a, 11a of the lead frame 10, 11, and FIG. 9B is a view illustrating a cross-section when the thickness of the signal line terminal S1, S2 is smaller than the thickness of the rectangular plate portion 10a, 11a of the lead frame 10, 11. As shown in FIG. 9A, when the thickness of the signal line terminal S1, S2 is the same as the thickness of the rectangular plate portion 10a, 11a of the lead frame 10, 11, the space between the signal line terminal S1, S2 and the heat radiation substrate 13, 15 is small. On the other hand, as shown in FIG. 9B, when the thickness of the signal line terminal S1, S2 is smaller than the thickness of the rectangular plate portion 10a, 11a of the lead frame 10, 11, the space between the signal line terminal S1, S2 and the heat radiation substrate 13, 15 can be increased. Therefore, the flowability of the resin during the resin-sealing can be enhanced.

The stress reduction effect and the effect of improving the flowability of the resin can be obtained for some extent even when the range where the thickness is reduced in the signal line terminal S1, S2 is limited only to the connecting portion to be connected to the semiconductor chip 7a, 7b. However, in the case where the range where the thickness of the signal line terminal S1, S2 is reduced is the entire range to be opposed to the heat radiation substrate 13, 15, these effects can be further obtained.

(6) In the present embodiment, the through holes 17, 18 are formed in the signal line terminals S1, S2, and the joining material 22 flows in the through holes 17, 18. Therefore, the signal line terminals S1, S2 and the joining material 22 can be further securely joined. Accordingly, the reliability of connection between the signal line terminals S1, S2 and the semiconductor chips 7a, 7b can be improved.

(7) In the present embodiment, the signal line terminals S1, S2 are also formed with the through holes 19 at the position outside of the portions to be connected to the semiconductor chips 7a, 7b. Therefore, the resin can be moved through the through holes 19 during the resin-sealing, and thus the fillability (flowability) of the resin can be further improved. In such the through holes 19, the fillability of the resin can be improved with the increase in area of the hole. On contrary, the resistance values of the signal line terminals S1, S2 increase due to the increase in the area of the hole. Therefore, the thickness and the width of the signal line terminals S1, S2 are preferably decided considering these factors.

(8) In the present embodiment, the heat radiation substrates 12-15 in which the insulated substrate 12b-15b is interposed between the conductive portion 12a-15a and the conductive portion 12c-15c are joined to the lead frame 9-11. Therefore, the semiconductor module 4 can be configured to have a structure of improving the cooling function when a cooling device or the like is fixed to the exposed surface of the heat radiation substrates 12-15. However, if the exposed surface is in the condition of being electrically connected to the lead frame 9-11, the cooling device or the like needs to be fixed to the exposed surface through an insulation film. In the case of the heat radiation substrates 12-15 of the present embodiment, the conductive portion 12a-15a and the conductive portion 12c-15c can be electrically separated by the insulated substrate 12b-15b. Therefore, it is possible to directly fix the cooling device or the like to the exposed surfaces of the heat radiation substrates 12-15.

Second Embodiment

A second embodiment of the present disclosure will be described. In the present embodiment, the structure of the lead frame 10 is modified from that of the first embodiment. The other structures are similar to the first embodiment, and thus only the portion different from the first embodiment will be described.

Figure 10:
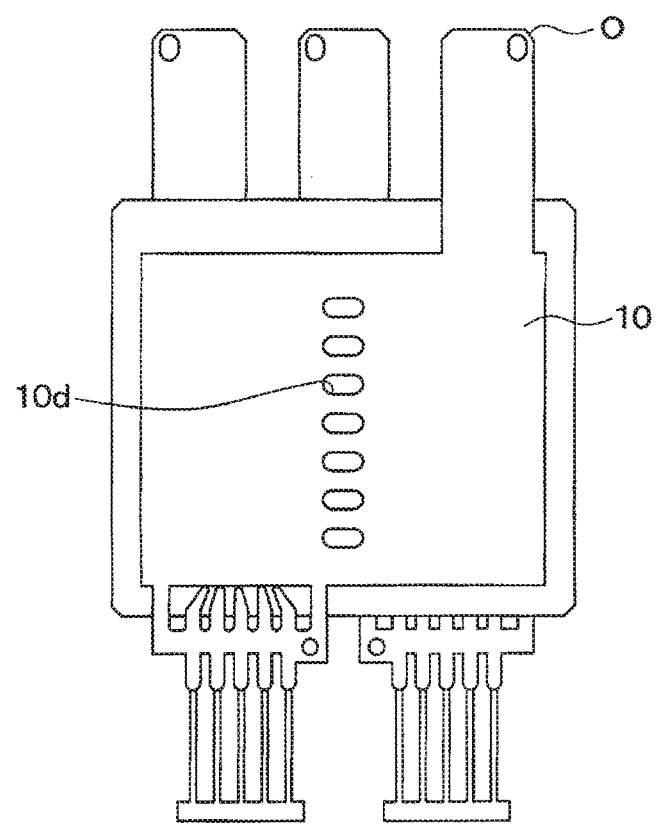
FIG. 10 is a view illustrating a front layout of a semiconductor module according to a second embodiment of the present disclosure.

FIG. 10 is a view illustrating a front layout of the semiconductor module 4 according to the present embodiment. In the present embodiment, as shown in this figure, the lead frame 10 is formed with a plurality of openings 10d between an area where the semiconductor chips 7a, 8a of the upper arm are arranged and an area where the semiconductor chips 7b, 8b of the lower arm are arranged.

As described above, it is preferable that the semiconductor module 4 has the symmetric structure on the opposite sides of the semiconductor chips 7, 8. However, as can be seen from the cross-section of FIG. 2B, only the portion between the area where the semiconductor chips 7a, 8a of the upper arm are arranged and the area where the semiconductor chips 7b, 8b of the lower arm are arranged is an asymmetric portion.

In the present embodiment, therefore, since the plurality of openings 10d is formed in this portion, the area of the lead frame 10 is reduced, and the asymmetric portion is reduced as small as possible. Therefore, the symmetry on the opposite sides of the semiconductor chips 7, 8 is further improved, and the curving due to the asymmetry can be reduced.

Modification of Second Embodiment

Figure 11:
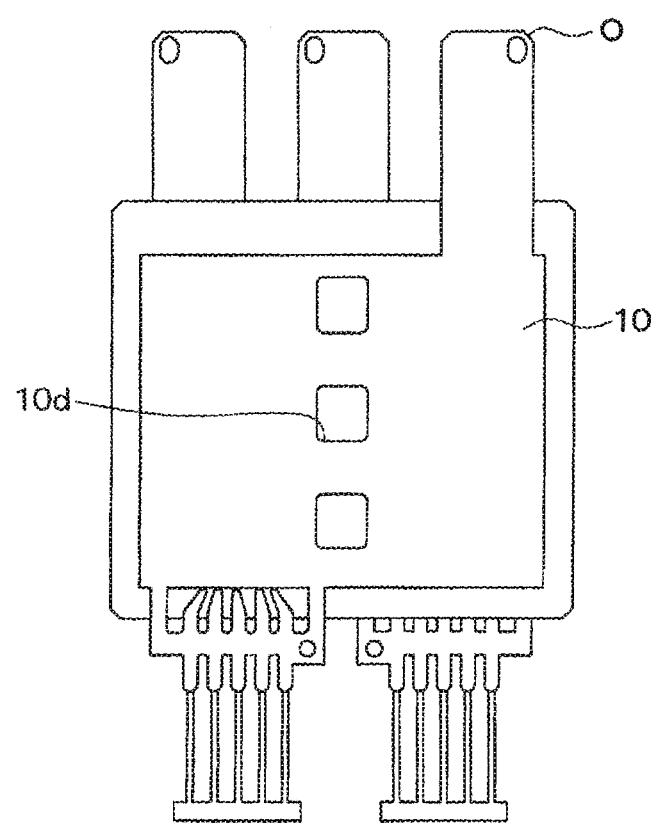
FIG. 11 is a view illustrating a front layout of a semiconductor module according to a modification of the second embodiment.

In the second embodiment described hereinabove, the number of the openings 10d is arbitral and may be any number. Namely, in FIG. 10, the lead frame 10 having seven openings 10d is illustrated. However, as shown in FIG. 11, three openings 10d may be formed. Alternatively, the number of the openings 10d may be one or any number other than three and seven. It is to be noted that the portion of the lead frame 10 between the area where the semiconductor chips 7a, 8a of the upper arm are arranged and the area where the semiconductor chips 7b, 8b of the lower arm are arranged serves as a wiring connecting between the upper arm and the lower arm, and a large current flows in this wiring. Therefore, if the number of the openings 10d is increased or the size of the openings 10d is increased, the cross-sectional area of the wiring connecting between the upper arm and thus the lower arm is reduced and the resistance of the wiring is increased. Therefore, the number of the opening 10d and the like are preferably determined considering the resistance of the wiring.

Third Embodiment

A third embodiment of the present disclosure will be described. In the present embodiment, the structure of the resin part 16 is modified from that of the first embodiment. The other structures are similar to the first embodiment, and thus only the portion different from the first embodiment will be described.

Figure 12:
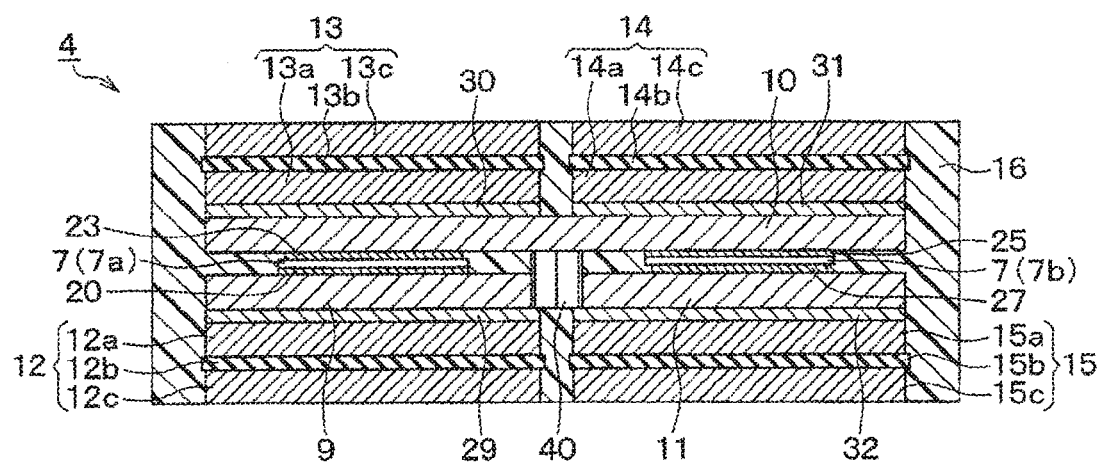
FIG. 12 is a cross-sectional view of a semiconductor module according to a third embodiment of the present disclosure.

FIG. 12 is a cross-sectional view of the semiconductor module 4 according to the present embodiment. As shown in this figure, in the present embodiment, a snubber circuit 40 is provided between the lead frame 9 and the lead frame 11. The snubber circuit 40 is a circuit made of a resistor R, a capacitor C, a diode Di and the like, and serves to reduce an inductance L formed between the lead frame 9 and the lead frame 11.

In the semiconductor module 4, the electric current flows through a current path formed in an order of lead frame 9→semiconductor chips 7a, 8a→lead frame 10→semiconductor chips 7b, 8b→lead frame 11. In this case, a large potential difference is generated between the lead frame 9 and the lead frame 11. Further, a value obtained by multiplying a change of current with time di/dt with the inductance L is a surge voltage ΔV. When the surge voltage ΔV is large, an insulation guarantee and an increase in switching loss become problems. Therefore, it is preferable to reduce the inductance L as small as possible.

Therefore, as the present embodiment, when the snubber circuit 40 is provided between the lead frame 9 and the lead frame 11, the inductance L between the lead frame 9 and the lead frame 11 is reduced, and thus the inductance can be further reduced. Therefore, it is effective to reduce the switching loss and the surge voltage.

The snubber circuit 40 may be arranged in any configuration between the lead frame 9 and the lead frame 11. In the present embodiment, the snubber circuit 40 is arranged such that the snubber circuit 40 is interposed between opposed end surfaces of the lead frame 9 and the lead frame 11. In this case, the space between the lead frame 9 and the lead frame 11 can be effectively used. It is not necessary to separately provide a space for the snubber circuit 40.

Fourth Embodiment

A fourth embodiment of the present disclosure will be described. In the present embodiment, the structure of the resin part 16 is modified from that of the first embodiment. The other structures are similar to the first embodiment, and thus only the portion different from the first embodiment will be described.

Figure 13:
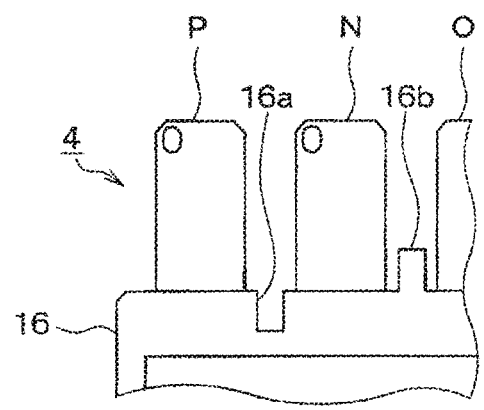
FIG. 13 is a view illustrating a front layout of a semiconductor module according to a fourth embodiment of the present disclosure.

FIG. 13 is an enlarged view of a part of the semiconductor module 4 according to the present embodiment. In the present embodiment, as shown in this figure, the resin part 16 is provided with a recessed portion 16a between the positive electrode terminal P and the negative electrode terminal N, and a projected portion 16b between the negative electrode terminal N and the output terminal O.

In the semiconductor module 4 as the first and second embodiments, the conductive portions 12c-15c of the heat radiation substrates 12-15 are internally insulated by the insulated substrates 12b-15b, and potential difference occurs within the resin part 16. Therefore, even if a portion between the conductive portion 12c and the conductive portion 15c and a portion between the conductive portion 13c and the conductive portion 14c are electrically conducted, there is no problem. Therefore, the portion between the conductive portion 12c and the conductive portion 15c and the portion between the conductive portion 13c and the conductive portion 14c may be narrowed.

However, in regard to the positive electrode terminal P, the negative electrode terminal N and the output terminal O, which expose from the resin part 16, a potential difference occurs between the positive electrode terminal P and the negative electrode terminal N, and between the negative electrode terminal N and the output terminal O. Therefore, it is necessary to make the creeping distance between them. On the other hand, as the present embodiment, when the recessed portion 16a or the projected portion 16b is provided between them, the creeping distance can be made as well as the distance between the positive electrode terminal and the negative electrode terminal can be reduced. As a result, it contributes to the reduction of the inductance. This means to reduce the space between the positive electrode terminal P and the negative electrode terminal N and the space between the positive electrode terminal N and the output terminal O.

As a result, the size of the semiconductor module 4 can be reduced. Further, the area of the power source closed loop is reduced, and the inductance L can be relatively small. Moreover, since the electric currents can flow in opposite directions at near positions, the magnetic fluxes are easily cancelled and the inductance L can be further reduced.

Fifth Embodiment

A fifth embodiment of the present disclosure will be described. In the present embodiment, a semiconductor device employing the semiconductor module 4 described in the first to fourth embodiments will be described. Here, although the semiconductor device employing the semiconductor module 4 of the third embodiment is described as an example, the semiconductor device may employ the semiconductor module 4 of the first, second or the fourth embodiment.

Figure 14:
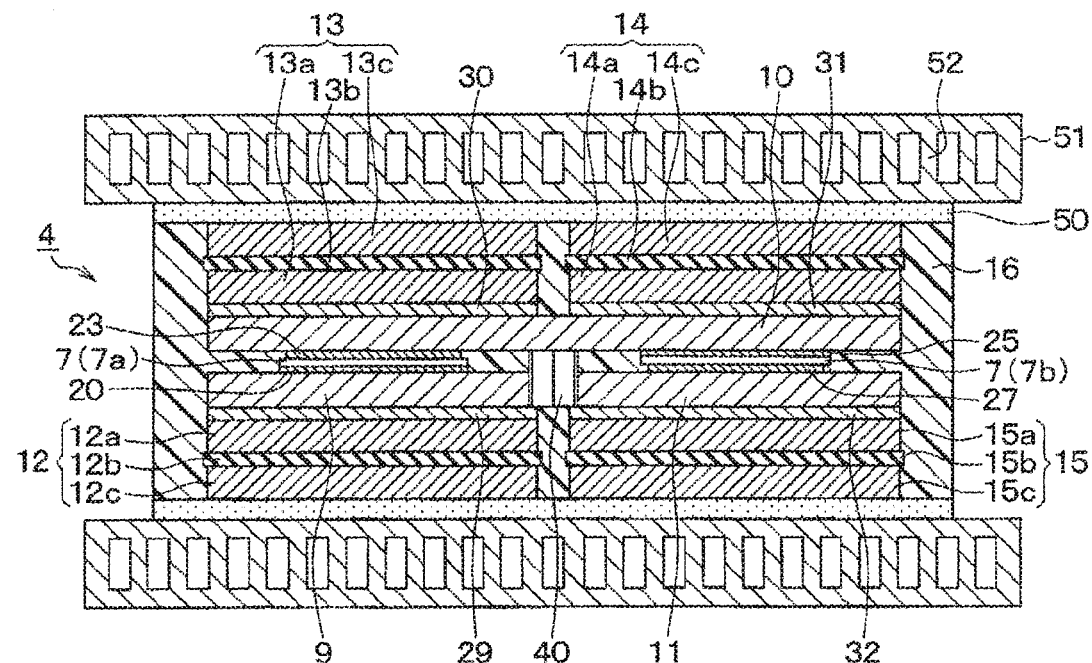
FIG. 14 is a cross-sectional view of a semiconductor device according to a fifth embodiment of the present disclosure.

FIG. 14 is a cross-sectional view of the semiconductor device according to the present embodiment. As shown in this figure, heat sinks 51 are provided on both sides of the semiconductor module 4 through a grease 50. In the inside of the heat sink 51, fins 52 are provided, and a refrigerant such as a cooling water is circulated through a non-illustrated cooling device. By this configuration, a cooling in an indirect cooling method where heat generated from the semiconductor module 4 is indirectly cooled through the grease 50 can be performed. In this way, the semiconductor device with a cooling mechanism can be provided by arranging the heat sinks 51 on both of the sides of the semiconductor module 4.

Sixth Embodiment

A sixth embodiment of the present disclosure will be described. In the present embodiment, the structure of the cooling mechanism is modified from that of the fifth embodiment. The other structures are similar to the fifth embodiment, and thus only the different portion will be described.

Figure 15:
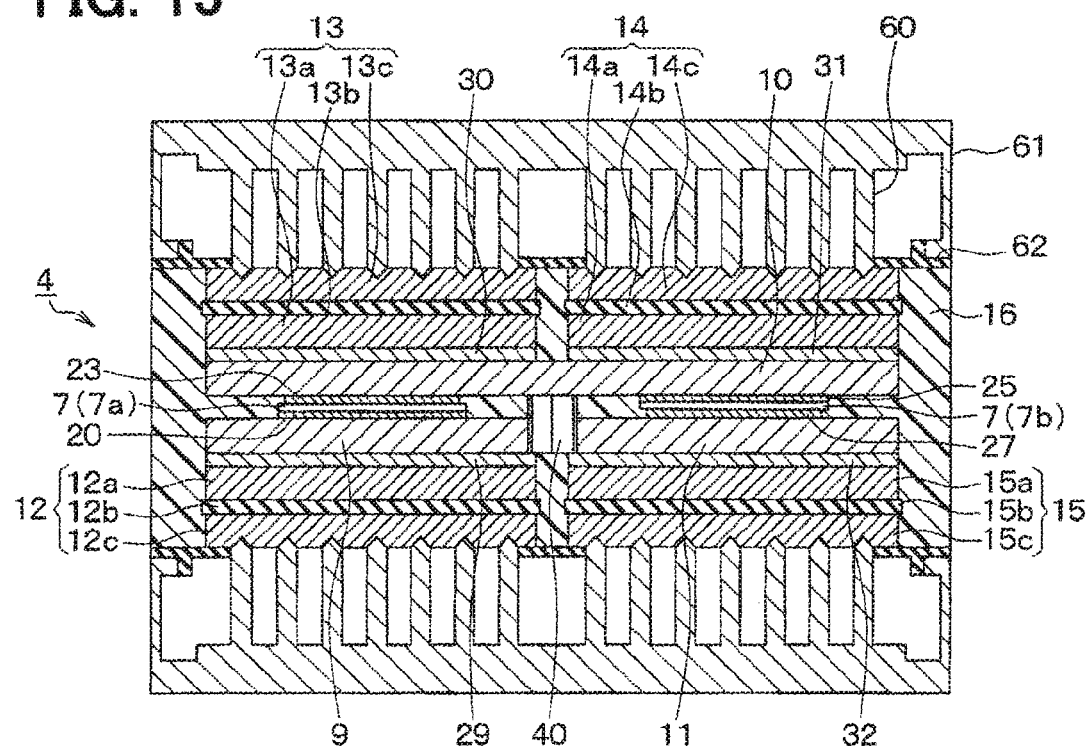
FIG. 15 is a cross-sectional view of a semiconductor device according to a sixth embodiment of the present disclosure.

FIG. 15 is a cross-sectional view of a semiconductor device according to the present embodiment. As shown in this figure, cases 61 are provided on both of the sides of the semiconductor module 4. The case 61 has a bottom wall on one side and a side wall surrounding the periphery of the bottom wall. The case 61 has an opening on the opposite side of the bottom wall, and fins 60 project from the bottom wall. In the inside of the case 61, a refrigerant such as a cooling water is circulated through a non-illustrated cooling device. The case 61 is disposed such that the fins 60 stick into the heat radiation substrates 12-15. A seal ring 62 is disposed between the side wall of the case 61 and the resin part 16 to restrict leakage of the refrigerant.

By this configuration, a cooling in a direct cooling method where the semiconductor module 4 is directly cooled by the refrigerant can be performed.

Although the structure of improving the cooling function can be achieved by fixing the heat sinks 61 to the exposed surfaces of the heat radiation substrates 12-15, if the exposed surfaces are in condition of being electrically conducted with the lead frames 9-11, the cooling device or the like needs to be fixed to the exposed surfaces through the insulation film or the like. Namely, only the indirect cooling method as described in the fifth embodiment is employed. However, in the semiconductor modules 4 described in the first to fourth embodiments, the heat radiation substrates 12-15 in which the insulated substrate 12b-15b is interposed between the conductive portion 12a-15a and the conductive portion 12c-15c are joined to the lead frames 9-11. Therefore, the conductive portion 12a-15a and the conductive portion 12c-15c are electrically separated by the insulated substrate 12b-15b. As such, it is possible to directly fix the heat sink 61 to the exposed surfaces of the heat radiation substrates 12-15, and it is possible to perform the cooling in the direct cooling method in which the refrigerant directly contacts with the exposed surfaces.

Figure 16:
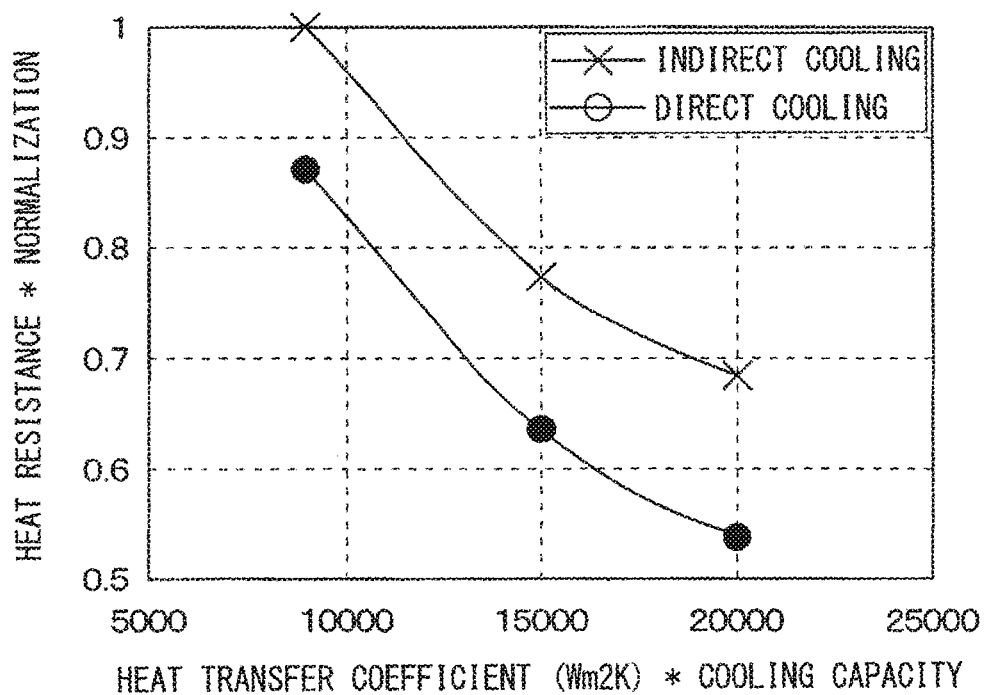
FIG. 16 is a graph illustrating comparison of a cooling capacity between the indirect cooling-type semiconductor device of the fifth embodiment and the direct cooling-type semiconductor device of the sixth embodiment.

FIG. 16 is a graph for comparing the cooling performance of the semiconductor device employing the indirect cooling method of the fifth embodiment and the cooling performance of the semiconductor device employing the direct cooling method of the present embodiment. As shown in this figure, in the direct cooling method, the heat resistance can be reduced by approximately 15% from that of the indirect cooling method. Therefore, the cooling performance can be improved by employing the direct cooling method as the present embodiment.

Here, the semiconductor device employing the semiconductor module 4 of the third embodiment is described as the example. The semiconductor device may employ the semiconductor module 4 of any of the first, second and fourth embodiments.

Seventh Embodiment

A seventh embodiment of the present disclosure will be described. In the present embodiment, the structure of the signal line terminals S1, S2 is modified from that of the first embodiment. The other structures are similar to the first embodiment, and thus only the different portion will be described.

Figure 17:
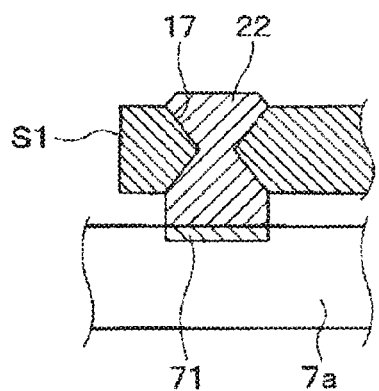
FIG. 17 is a cross-sectional view of the vicinity of an end of a signal line terminal S1 of a semiconductor module according to a seventh embodiment of the present disclosure.

FIG. 17 is a cross-sectional view of the vicinity of the end of the signal line terminal S1 of the semiconductor module 4 according to the present embodiment. In the first embodiment, the through hole 17 of the signal line terminal S1 has the cylindrical shape with a constant inside diameter. In the present embodiment, as shown in FIG. 17, the inside diameter of the through hole 17 of the signal line terminal S1 is varied such that the inside diameter is minimum at the mid-position with respect to a depth direction of the through hole 17 and gradually increases toward the front surface and the rear surface of the signal line terminal S1. This shape can be realized by performing a double-etching to the through hole 17 from the front surface side and the rear surface side.

In such a structure, when the joining material 22 enters the through hole 17, the joining material 22 is caught by the inner surface of the through hole 17 and is not removed from the through hole 17. Therefore, the anchor effect can be further exerted. Here, although the description is made with regard to the signal line terminal S1, the same structure can be employed also to the signal line terminal S2.

Figure 18A:
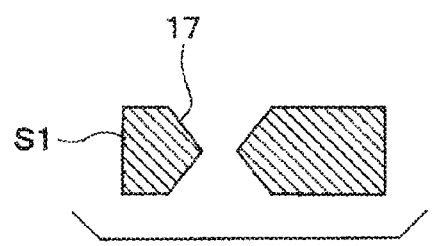
FIGS. 18A, 18B, and 18C are cross-sectional views illustrating a state of a joining material placed in a through hole.
Figure 18B:
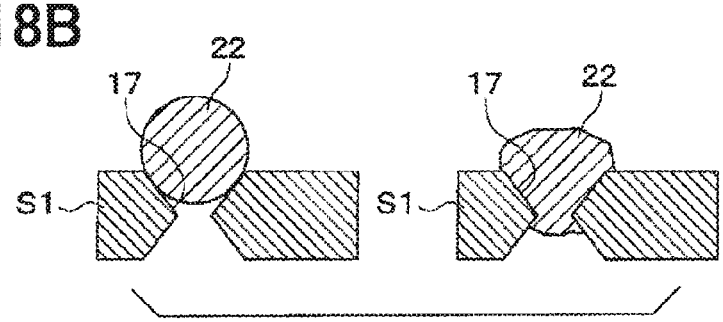
Figure 18C:
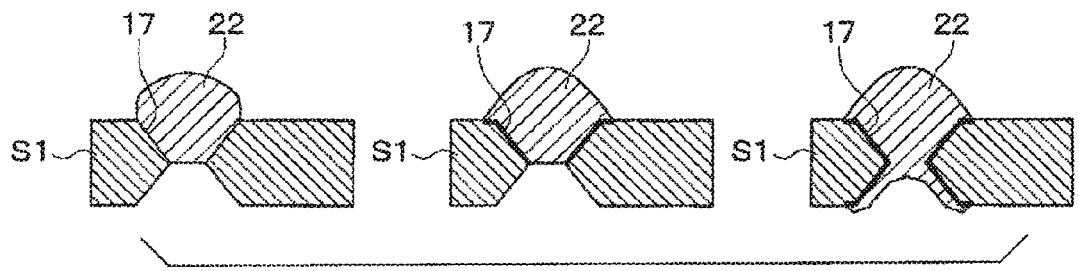
Figure 21:
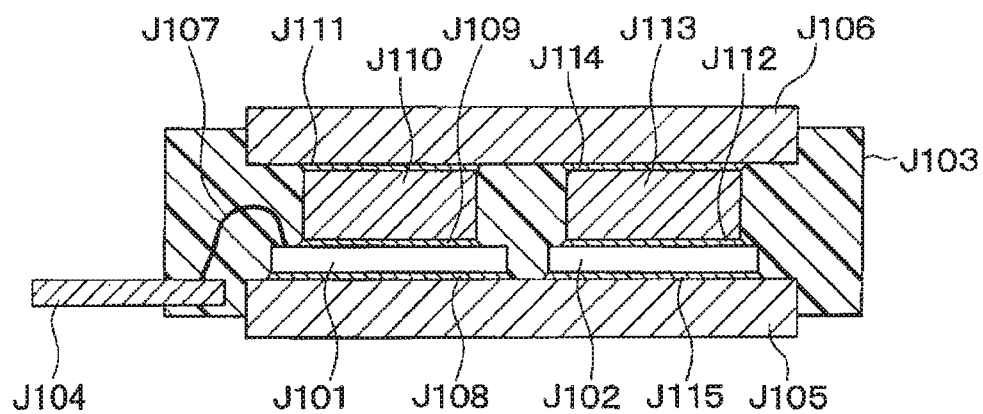
FIG. 21 is a cross-sectional view of another conventional semiconductor module.
Figure 22A:
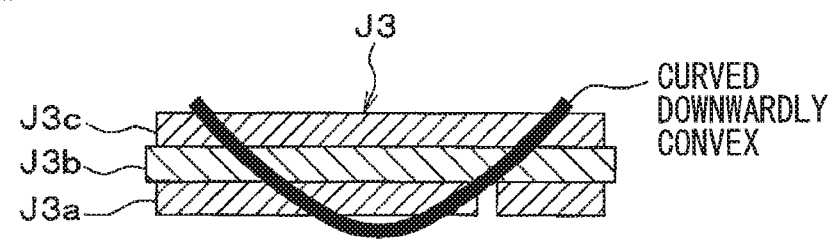
FIG. 22A is an enlarged view of a heat radiation substrate of the semiconductor module shown in FIG. 20, and FIG.
Figure 22B:
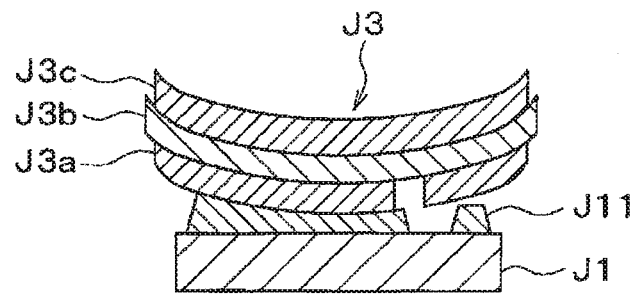

In this structure, the joining material 22 is arranged to the through hole 17 in the following method. FIGS. 18A, 18B, and 18C are cross-sectional views illustrating the method of arranging the joining material 22 to the through hole 17.

First, as shown in FIG. 18A, the signal line terminal S1 formed with the through hole 17 is prepared. Next, the joining material 22 is mounted on the through hole 17 in such a manner that a solder ball is placed as shown in the left view of FIG. 18B, or in such a manner that a solder paste or the like is applied by dispensing as shown in the right view of FIG. 18B. In the case of using the solder ball, if the lead frame 10 is turned upside down, the solder ball drops from the signal line terminal S1. Therefore, the lead frame 10 cannot be turned upside down and should be maintained in this state. On the other hand, in the case of using the solder paste or the like, the solder paste or the like does not drop from the signal line terminal S1 even if the lead frame 10 is turned upside down.

Therefore, in the case where the solder ball is used, the joining material 22 is melted by the reflowing process, so that the joining material 22 is damp and joined to the signal line terminal S1. For example, in a case where the surface of the signal line terminal S1 is coated only with a Ni plating, the joining material 22 having a bump shape is formed according to an applied area of the joining material, as shown in the left view of FIG. 18C. In a case where the surface of the signal line terminal S1 is coated with an Au plating for improving the wettability in an area denoted with a solid line as shown in the middle view or the right view of FIG. 18C, the joining material 22 is damp and expands. Therefore, it is possible to increase an adhesion area with the signal line terminal S1.

As described above, in the case where the solder paste or the like is used, it proceeds to the step shown in FIG. 4B described in the first embodiment immediately after the joining material 22 is placed on the signal line terminal S1. In the case where the solder ball is used, it proceeds to the step shown in FIG. 4B after the joining material 22 is melted by performing the reflowing process. Thereafter, the steps shown in FIGS. 4C and 4D are performed. Therefore, the semiconductor module 4 in which the through hole 17 of the signal line terminal S1 has the shape of the present embodiment can be manufactured.

Here, the description is made with regard to the signal line terminal S1 as an example. Further, the signal line terminal S2 can have the similar structure, and the similar effects can be achieved.

Modification of Seventh Embodiment

In the case of forming the through holes 17 having the structure as described in the seventh embodiment, the dimension of the signal line electrodes 71 including the gate electrode, which are connected to the signal line terminals S1 of the semiconductor chip 7a, and the diameter of the through holes 17 on the front surface of the signal line terminals S1, that is, the diameter of the through holes 17 on the opposite side of the signal line electrodes 71 may have the following relationship. In this case, the dimension of the signal line electrode 71 means a minimum dimension passing through the center of the signal line electrode 71. In the case where the signal line electrode 71 has a circular shape, the dimension of the signal line electrode 71 corresponds to a diameter of the signal line electrode 71. In the case where the signal line electrode 71 has a square shape, the dimension of the signal line electrode 71 corresponds to the side of the signal line electrode 71.

FIG. 19A is a cross-sectional view of the vicinity of the end of the signal line terminal S1 of the semiconductor module 4 according to this modification in a case where positions of the signal line terminal S1 and the signal line electrode 71 are not displaced. FIG. 19B is a cross-sectional view of the vicinity of the end of the signal line terminal S1 of the semiconductor module 4 according to this modification in a case where the positions of the signal line terminal S1 and the signal line electrode 71 are displaced.

As shown in FIG. 19A, it is preferable that the diameter $\phi L$ of the through hole 17 on the front and rear surfaces of the signal line terminal S1 is smaller than the dimension $\phi e$ of the signal line electrodes 71 of the semiconductor chip 7a, which include the gate electrode, connected to the signal line terminals S1 (φL<φe).

In this case, when the positions of the through hole 17 and the signal line electrode 71 are displaced from each other as shown in FIG. 19B due to the positional displacements of the signal line terminal S1 and the semiconductor chip 7a, the wet angles α, β can be made to acute angles. The crack of the joining material 22 due to the stress caused by vibrations or the like is likely to easily occur as the wet angles α, β are nearer to 0°. Since the wet angles α, β can be made to the acute angles, the structure can reduce the occurrence of the crack.

Other Embodiments

In the embodiments described above, the semiconductor module 4 having a 2-in-1 structure was described as an example. However, the semiconductor module 4 may have a structure where the signal line terminals S1, S2 are provided by the lead frames 10, 11 that are joined to the electrodes (emitter electrodes 72) disposed on the same surface as the electrodes (signal line electrodes 71 including the gate electrode) connected to the signal line terminals S1, S2 are mounted, in the semiconductor chips 7a, 7b. That is, the present disclosure may be adapted to the semiconductor module 4 having a 1-in-1 structure, a 6-in-1 structure in which six semiconductor power elements including three upper arms and three lower arms are sealed in one resin part, or the like.

In the embodiment described above, the semiconductor module 4 has the 2-in-1 structure. Therefore, it is appreciated that the present disclosure is adapted to each of the upper arm and the lower arm. Namely, in the present disclosure, in a case where the positive electrode terminal P corresponds to a first terminal and the lead frame 9 corresponds to a first lead frame, the output terminal O corresponds to a second terminal and the lead frame 10 corresponds to a second lead frame. In a case where the output terminal O corresponds to the first terminal and the lead frame 10 corresponds to the first lead frame, the positive electrode terminal N corresponds to the second terminal and the lead frame 11 corresponds to the second lead frame.

In the embodiments described above, the semiconductor chip 7a formed with the IGBT and the semiconductor chip 8a formed with the FWD are separate chips, and the semiconductor chip 7b formed with the IGBT and the semiconductor chip 8b formed with the FWD are separate chips. Alternatively, these chips may be integrated into one chip.

In the embodiments described above, the vertical-type IGBT is described as an example of the semiconductor power element. Alternatively, the semiconductor power element may be a vertical-type power MOSFET. Namely, the present disclosure may be adapted to the semiconductor module 4 having the semiconductor chip 7a, 7b in which the signal line electrodes and a front surface electrode are formed on the front surface, and a rear surface electrode is formed on the rear surface.

In the first embodiment described above, the primary fixing is performed by performing the reflowing process after the joining material 22 is placed on the through hole 17. However, in the case where the solder paste or the like is used as the joining material 22, the joining material 22 becomes in a condition adhered to the signal line terminal S1 for some extent. In such a case, therefore, the manufacturing process may proceed to the step shown in FIG. 4B without performing the reflowing process.

The shape and the like of the components of the semiconductor module 4 described in the embodiments can be suitably modified. For example, the portion of the lead frame 9-11 joined to the semiconductor chip 7, 8 is the rectangular plate portion 9a-11a. However, it is not always necessary that the portion of the lead frame 9-11 joined to the semiconductor chip 7, 8 has the rectangular shape.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

The invention claimed is:
1. A semiconductor module comprising:
a semiconductor chip having a front surface and a rear surface, the semiconductor chip being provided with a vertical-type semiconductor power element, the semiconductor chip having a signal line electrode and a front surface electrode on the front surface, and a rear surface electrode on the rear surface;
a first lead frame being connected to the rear surface electrode of the semiconductor chip, and including a first terminal;
a second lead frame including a signal line terminal connected to the signal line electrode of the semiconductor chip, and a plate portion that is connected to the front surface electrode of the semiconductor chip, and from which a second terminal extends;
a first heat radiation substrate being joined to a surface of the first lead frame opposite to a surface on which the semiconductor chip is disposed;
a second heat radiation substrate being joined to a surface of the second lead frame opposite to a surface on which the semiconductor chip is disposed; and
a resin part, wherein the semiconductor chip, the first lead frame the second lead frame, the first heat radiation substrate and the second heat radiation substrate are sealed by the resin part such that the first terminal and the second terminal are exposed from the resin part and a surface of the first heat radiation substrate opposite to a surface joined to the first lead frame and a surface of the second heat radiation substrate opposite to a surface joined to the second lead frame are exposed from the resin part, wherein
each of the first heat radiation substrate and the second heat radiation substrate includes a first conductive portion, a second conductive portion and an insulated substrate, the first conductive portion providing the surface joined to corresponding one of the first lead frame and the second lead frame, the second conductive portion providing the surface exposed from the resin part, the insulated substrate being disposed between the first conductive portion and the second conductive portion,
each of the first conductive portion and the second conductive portion has a solid shape without being divided,
the first conductive portion and the second conductive portion have a symmetric shape, the first lead frame and the first heat radiation substrate are disposed on one side of the semiconductor chip to provide a component structure, the second lead frame and the second heat radiation substrate are disposed on the other side of the semiconductor chip to provide a component structure, the component structure of the one side of the semiconductor chip and the component structure of the other side of the semiconductor chip are symmetric with respect to the semiconductor chip, and the signal line terminal and the signal line electrode are joined to each other through a joining material having a bump.

2. The semiconductor module according to claim 1, wherein an end of the signal line terminal adjacent to the plate portion has a thickness smaller than that of the plate portion.

3. The semiconductor module according to claim 1, wherein the signal line terminal is formed with a through hole at a position joined through the joining material the through hole passing from a front surface to a rear surface of the signal line terminal, and the joining material is entered in the through hole.

4. The semiconductor module according to claim 3, wherein a diameter of the through hole is minimum at a middle position with respect to a depth direction of the through hole and gradually increases toward the front surface and the rear surface of the signal line terminal.

* * * * *